(12) United States Patent
Sasagawa et al.

(10) Patent No.: US 8,343,849 B2
(45) Date of Patent: Jan. 1, 2013

(54) METHOD FOR MANUFACTURING SOI SUBSTRATE

(75) Inventors: Shinya Sasagawa, Chigasaki (JP); Motomu Kurata, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/490,431

(22) Filed: Jun. 24, 2009

(65) Prior Publication Data

US 2009/0325364 A1 Dec. 31, 2009

(30) Foreign Application Priority Data

Jun. 26, 2008 (JP) ................................. 2008-167618

(51) Int. Cl.
*H01L 21/762* (2006.01)
(52) U.S. Cl. ................. 438/458; 257/E21.568
(58) Field of Classification Search .......... 438/455–465, 438/795–799, 106–113, 510–527, 704–712
See application file for complete search history.

(56) References Cited

U.S. PATENT DOCUMENTS

| 6,159,825 | A * | 12/2000 | Henley et al. ................. 438/460 |
| 7,119,365 | B2 | 10/2006 | Takafuji et al. |
| 7,332,410 | B2 * | 2/2008 | Tong ............................. 438/455 |
| 2006/0073644 | A1 * | 4/2006 | Atoji et al. .................... 438/147 |
| 2007/0063281 | A1 | 3/2007 | Takafuji et al. |
| 2007/0232022 | A1 * | 10/2007 | Henley et al. ................. 438/455 |
| 2008/0200010 | A1 * | 8/2008 | Endo et al. .................... 438/458 |
| 2009/0239354 | A1 * | 9/2009 | Suzawa et al. ................ 438/458 |

FOREIGN PATENT DOCUMENTS

JP 2004-087606 A 3/2004

* cited by examiner

*Primary Examiner* — Savitr Mulpuri
(74) *Attorney, Agent, or Firm* — Eric J. Robinson; Robinson Intellectual Property Law Office, P.C.

(57) ABSTRACT

To provide a technical means which is capable of increasing crystallinity and planarity of a single crystal semiconductor layer, crystal defects are reduced in such a manner that a single crystal semiconductor substrate, in which an insulating film is formed on its surface and an embrittlement region is formed in a region at a predetermined depth from the surface, and a supporting substrate are attached to each other with the insulating film interposed therebetween; the single crystal semiconductor substrate is separated in the embrittlement region by a heat treatment; a single crystal semiconductor layer is irradiated with laser light over the supporting substrate with the insulating film interposed therebetween; a surface of the single crystal semiconductor layer is etched; and a plasma treatment is performed on the surface of the single crystal semiconductor layer.

35 Claims, 17 Drawing Sheets

METHOD FOR MANUFACTURING SOI SUBSTRATE

BACKGROUND OF THE INVENTION

1. Field of the Invention

The present invention relates to a silicon-on-insulator (SOI) substrate, a method for manufacturing the SOI substrate, a semiconductor device using the SOI substrate, and a method for manufacturing the semiconductor device.

2. Description of the Related Art

In recent years, instead of a bulk silicon wafer, integrated circuits using a silicon-on-insulator (SOI) substrate where a thin single crystal semiconductor film is present on an insulating surface have been developed. Since parasitic capacitance between a drain of a transistor and a substrate is reduced using the SOI substrate, the SOI substrate has attracted attention as a substrate which improves performance of semiconductor integrated circuits.

One of known methods for manufacturing an SOI substrate is a Smart Cut (registered trademark) method. An outline of the method for manufacturing an SOI substrate by a Smart Cut (registered trademark) method is described below. First, hydrogen ions are implanted into a silicon wafer by an ion implantation method to form an embrittlement region at a predetermined depth from a surface. Then, the silicon wafer into which the hydrogen ions are implanted is attached to another silicon wafer with a silicon oxide film interposed therebetween. After that, a single crystal silicon layer can be formed on the silicon wafer in such a manner that a heat treatment is performed so that the silicon wafer into which hydrogen ions are implanted is separated as a thin film in the embrittlement region. The Smart Cut (registered trademark) method is also referred to as a hydrogen ion implantation separation method.

A method has also been proposed in which a single crystal silicon layer is formed over a base substrate made of glass by such a Smart Cut (registered trademark) method (for example, see Reference 1). Since glass substrates can have a larger area and are less expensive than silicon wafers, the glass substrates are mainly used for manufacturing liquid crystal display devices and the like. With the use of glass substrates as base substrates, inexpensive large-area SOI substrates can be manufactured.

REFERENCE

Patent Document

[Reference 1] Japanese Published Patent Application No. 2004-87606

SUMMARY OF THE INVENTION

However, as for a thin single crystal silicon layer attached to a glass substrate, the planarity of the surface of the single crystal silicon layer deteriorates due to implantation of hydrogen ions and separation in an embrittlement region. For example, crystal defects remain in the single crystal silicon layer, and the embrittlement region or damage remains on the surface of the single crystal semiconductor layer. In a conventional technique, a heat treatment at a temperature of equal to or greater than 1000° C. is performed to recover the crystallinity of a single crystal silicon layer attached to a silicon wafer; however, such a high-temperature process cannot be used to recover the crystallinity of a single crystal silicon layer attached to a glass substrate having a strain point of equal to or less than 700° C.

Meanwhile, it is necessary to suppress unevenness of the surface of the single crystal silicon layer in order to form a high-performance semiconductor element. This is because in the case of manufacturing a transistor using an SOI substrate, a gate electrode is formed over a semiconductor layer with a gate insulating film interposed therebetween; therefore, if there is large unevenness on the semiconductor layer surface, it is difficult to form a gate insulating film with high withstand voltage. In addition, a thin gate insulating film is needed for higher withstand voltage, but if surface unevenness of the semiconductor layer is large, increase of interface state density with the gate insulating film or the like causes deterioration of performance of a semiconductor element, such as decrease in field effect mobility or increase in threshold voltage value.

According to one embodiment of the present invention, which is made in view of the above problems, it is an object to provide a technical means which is capable of increasing planarity of a single crystal semiconductor layer and reducing crystal defects thereof. In addition, another object is to provide a technical means which is capable of increasing the planarity of the single crystal semiconductor layer and reducing crystal defects thereof, even when a substrate having low heat resistance is used as a supporting substrate of the single crystal semiconductor layer. Further, it is another object to provide a technical means which is capable of manufacturing a single crystal semiconductor layer having high crystallinity and planarity with high yield.

In order to achieve the above objects, according to one embodiment of the present invention, a method for manufacturing an SOI substrate includes the steps of: attaching a single crystal semiconductor substrate, in which an insulating film is formed on its surface and an embrittlement region is formed in a region at a predetermined depth from the surface, and a supporting substrate to each other with the insulating film interposed therebetween; separating the single crystal semiconductor substrate in the embrittlement region by a heat treatment; forming a single crystal semiconductor layer over the supporting substrate with the insulating film interposed therebetween; irradiating the single crystal semiconductor layer with laser light; etching a surface of the single crystal semiconductor layer; and performing a plasma treatment on the surface of the single crystal semiconductor layer.

The plasma treatment is preferably performed by exposing the surface of the single crystal semiconductor layer to plasma including OH free radicals. By exposing the surface to the plasma including OH free radicals, the OH free radicals act on defects, distortion, dangling bonds, or the like, so that dangling bonds can be terminated with the OH free radicals. As a result, crystal defects in the single crystal semiconductor layer can be reduced.

According to another embodiment of the present invention, a method for manufacturing an SOI substrate includes the steps of: forming an insulating film on a surface of a single crystal semiconductor substrate; forming an embrittlement region in a region at a predetermined depth from one surface of the single crystal semiconductor substrate by irradiating the single crystal semiconductor substrate with an ion beam through the insulating film; attaching the insulating film on the side of the single crystal semiconductor substrate, on which the embrittlement region is formed, and one surface of a supporting substrate; separating the single crystal semiconductor substrate in the embrittlement region by a heat treatment into the supporting substrate to which a single crystal semiconductor layer is attached, and part of the single crystal semiconductor substrate; irradiating the single crystal semiconductor layer with laser light; etching a surface of the single crystal semiconductor layer; performing a plasma treatment on the surface of the single crystal semiconductor layer; and performing a heat treatment on the single crystal semiconductor layer.

In addition, according to another embodiment of the present invention, a method for manufacturing an SOI substrate includes the steps of: forming an insulating film on a surface of a single crystal semiconductor substrate; forming an embrittlement region in a region at a predetermined depth from one surface of the single crystal semiconductor substrate by irradiating the single crystal semiconductor substrate with an ion beam through the insulating film; attaching the insulating film on the side of the single crystal semiconductor substrate, on which the embrittlement region is formed, and one surface of a supporting substrate; separating the single crystal semiconductor substrate in the embrittlement region by a heat treatment into the supporting substrate to which a single crystal semiconductor layer is attached, and part of the single crystal semiconductor substrate; irradiating the single crystal semiconductor layer with laser light; etching a surface of the single crystal semiconductor layer; performing a heat treatment on the single crystal semiconductor layer; and performing a plasma treatment on the surface of the single crystal semiconductor layer.

The plasma treatment which is performed on the surface of the single crystal semiconductor layer is preferably performed while the supporting substrate is heated. The temperature of the supporting substrate may be equal to or greater than 100° C. and equal to or less than 280° C., preferably equal to or greater than 220° C. and equal to or less than 280° C.

The plasma treatment which is performed on the surface of the single crystal semiconductor layer is preferably performed with a plasma treatment apparatus in which a plasma generation chamber and a reaction chamber are separated from each other.

Note that the term "single crystal" in this specification refers to a crystal in which crystal faces and crystal axes are aligned and atoms or molecules which are included in the single crystal are aligned in a spatially ordered manner. However, although single crystals are structured by orderly aligned atoms, single crystals may include a lattice defect in which the alignment is disordered as part or single crystals may include intended or unintended lattice strain.

Note that a semiconductor device in this specification generally indicates a device which is capable of functioning by utilizing semiconductor characteristics, and electro-optic devices, semiconductor circuits, and electronic devices are all semiconductor devices.

In addition, in this specification, a display device includes a light-emitting device and a liquid crystal display device. The light-emitting device includes a light-emitting element, and the liquid crystal display device includes a liquid crystal element. A light-emitting element refers to an element, luminance of which is controlled by current or voltage. Specifically, a light-emitting element refers to an inorganic EL (electroluminescence) element, an organic EL element, and the like.

Even when a supporting substrate having low heat resistance is used, the planarity can be increased and crystal defects can be reduced sufficiently by applying one embodiment of the present invention. In addition, a semiconductor device having excellent characteristics can be manufactured using such an SOI substrate.

DETAILED DESCRIPTION OF THE INVENTION

Figure 1A:
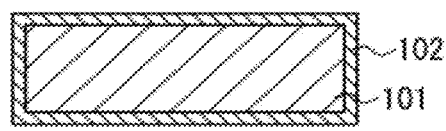
FIGS. 1A to 1E illustrate a method for manufacturing an SOI substrate according to Embodiment 1.

Embodiments and examples of the present invention will be hereinafter described with reference to the accompanying drawings. However, the present invention can be implemented in various modes, and it is easily understood by those skilled in the art that modes and details thereof can be modified in various ways without departing from the spirit and the scope of the present invention. Therefore, the present invention should not be interpreted as being limited to the description of the embodiments and examples. Note that the same portions or portions having the same functions in all the drawings for describing embodiments and examples are denoted by the same reference numerals and repetitive explanation thereof will be omitted.

Embodiment 1

In this embodiment, a method for manufacturing an SOI substrate, in which a single crystal semiconductor layer is fixed to a supporting substrate with an insulating film interposed therebetween, will be described.

First, a single crystal semiconductor substrate 101 is prepared. The single crystal semiconductor substrate 101 is processed to have a desired size and shape. The single crystal semiconductor substrate 101 is, for example, a single crystal silicon substrate, a germanium substrate, a compound semiconductor substrate such as a gallium arsenide substrate or an indium phosphide substrate, or the like. A size of a commercial silicon substrate is typically five inches (125 mm) in diameter, six inches (150 mm) in diameter, eight inches (200 mm) in diameter, or 12 inches (300 mm) in diameter, and a typical shape thereof is a circular shape. In addition, a circular substrate which is 18 inches (450 mm) in diameter can also be used. Note that the shape is not limited to a circular shape and a silicon substrate which is processed into a rectangle shape can be used. The case where a single crystal silicon substrate is used as the single crystal semiconductor substrate 101 is described below.

An insulating film 102 is formed over the single crystal semiconductor substrate 101 (see FIG. 1A). The insulating film 102 can have a single-layer structure or a stacked structure including two or more layers. As a film which is used for the insulating film 102, a film containing silicon or germanium as its component such as a silicon oxide film, a silicon nitride film, a silicon oxynitride film, a silicon nitride oxide film, a germanium oxide film, a germanium nitride film, a germanium oxynitride film, a germanium nitride oxide film, or the like can be used. Further, an insulating film including metal oxide such as aluminum oxide, tantalum oxide, or hafnium oxide; an insulating film including metal nitride such as aluminum nitride; an insulating film including metal oxynitride such as an aluminum oxynitride film; or an insulating film including metal nitride oxide such as an aluminum nitride oxide film can also be used as the insulating film 102.

The insulating film used for the insulating film 102 is formed by a chemical vapor deposition (CVD) method, a sputtering method, or an atomic layer epitaxy (ALE) method, or by oxidizing or nitriding the single crystal semiconductor substrate 101. As a CVD method, there are a low-pressure CVD method, a thermal CVD method, a plasma-enhanced CVD method (hereinafter referred to as a PECVD method), and the like. A PECVD method is preferable because it is a low-temperature treatment at a temperature of equal to or less than 350° C. and has a higher deposition rate than other CVD methods.

The first insulating film 102 preferably includes at least one layer of an insulating film to be a barrier layer for preventing penetration of sodium into a single crystal semiconductor layer 112. The barrier layer may include one layer or two or more layers. In the case where a substrate containing impurities such as an alkali metal or an alkaline earth metal which may reduce reliability of a semiconductor device (typically a glass substrate) is used as a supporting substrate 111, the impurities might diffuse into the single crystal semiconductor layer 112 from the supporting substrate 111 when the supporting substrate 111 is heated. Therefore, by formation of the barrier layer, such impurities that may reduce reliability of a semiconductor device, such as an alkali metal or an alkaline earth metal, can be prevented from being moved to the single crystal semiconductor layer 112. As the film that functions as a barrier layer, a silicon nitride film, a silicon nitride oxide film, an aluminum nitride film, an aluminum nitride oxide film, and the like are given. When the insulating film 102 has a stacked structure of two or more layers and includes such a film, the insulating film 102 can function as a barrier layer.

In the case where the insulating film 102 is formed with a single-layer structure, a film functioning as a barrier layer is preferably formed as the insulating film 102. In that case, the insulating film 102 with a single-layer structure can be formed using a silicon nitride film, a silicon nitride oxide film, an aluminum nitride film, or an aluminum nitride oxide film with a thickness of equal to or greater than 5 nm and equal to or less than 200 nm.

In addition, when the insulating film 102 has a single-layer structure, the single crystal semiconductor substrate 101 in which an oxide film is formed on its surface by performing an oxidation treatment on the single crystal semiconductor substrate 101 can be used. A thermal oxidation treatment for forming this oxide film can be dry oxidation, in which a gas containing a halogen element is preferably added to an oxidation atmosphere. An oxide film containing a halogen element can be formed as the insulating film 102. As the gas containing a halogen element, one or plural kinds of gases selected from HCl, HF, $NF_3$, HBr, Cl, ClF, $BCl_3$, F, $Br_2$, dichloroethylene (DCE), or the like can be used. Further, in the case of using trans-1,2-dichloroethylene as dichloroethylene, because the temperature at which trans-1,2-dichloroethylene is thermally decomposed is low, trans-1,2-dichloroethylene is effective when the thermal oxidation treatment is desired to be performed at a low temperature. Note that instead of trans-1,2-dichloroethylene, cis-1,2-dichloroethylene, 1,1-dichloroethylene, or a mixed gas of two or more of those gases may be used.

For example, in this embodiment, a heat treatment is performed at a temperature of equal to or greater than 700° C. in an atmosphere containing HCl at 0.5 volume % to 10 volume % (preferably 3 volume %) with respect to oxygen. It is preferable that thermal oxidation be performed at a heating temperature of equal to or greater than 950° C. and equal to or less than 1100° C. The treatment time may be 0.1 hour to 6 hours, preferably, 0.5 hour to 1 hour. The thickness of the oxide film which is formed can be 10 nm to 1000 nm (preferably 50 nm to 200 nm), for example, 100 nm.

By performing the oxidation treatment within such a temperature range, a gettering effect due to a halogen element can be obtained. Gettering has an effect of removing impurities such as metal, in particular. That is, by the action of a halogen element, impurities such as metal becomes volatile chloride and is released into air, whereby impurities are removed from the single crystal semiconductor substrate 101. Moreover, by a halogen element contained in the oxidation atmosphere, dangling bonds on a surface of the single crystal semiconductor substrate 101 are terminated, and localized level density at an interface between the oxide film and the single crystal semiconductor substrate 101 can be reduced.

By this thermal oxidation treatment in an atmosphere containing a halogen element, a halogen element can be contained in the oxide film which is used as the insulating film 102. When a halogen element is contained at a concentration of $1 \times 10^{16}/cm^3$ to $5 \times 10^{21}/cm^3$, the oxide film can function as a protective film which prevents contamination of the single crystal semiconductor layer 112 by capturing impurities such as a metal in the single crystal semiconductor substrate 101.

In order to contain a halogen element in the oxide film which is used as the insulating film 102, the oxide film may be formed in a chamber of a PECVD apparatus containing a fluoride gas or a fluorine gas. A process gas for forming the oxide film is supplied to such a chamber, this process gas is excited to generate plasma, and chemical reaction of active species in the plasma is caused. Accordingly, the oxide film is formed over the single crystal semiconductor substrate 101.

Figure 1C:
Figure 1B:
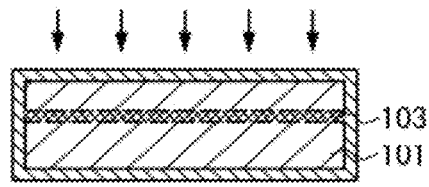

Next, through the insulating film 102, the single crystal semiconductor substrate 101 is irradiated with ions, whereby the ions are introduced into the single crystal semiconductor substrate 101; accordingly, an embrittlement region 103 is formed in a region at a predetermined depth from one surface of the single crystal semiconductor substrate 101 (FIG. 1B).

The depth at which the embrittlement region 103 is formed can be adjusted by the accelerating voltage of the ions and the incidence angle thereof. The embrittlement region 103 is formed at the same depth or substantially the same depth as the average depth at which the ions have entered. The thickness of the single crystal semiconductor layer 112 to be separated from the single crystal semiconductor substrate 101 in a later step depends on the depth of the single crystal semiconductor substrate 101, at which ions are introduced. The depth at which the embrittlement region 103 is formed is equal to or greater than 10 nm and equal to or less than 500 nm, preferably the depth is equal to or greater than 50 nm and equal to or less than 200 nm.

An ion doping apparatus can be used in order to introduce ions to the single crystal semiconductor substrate 101. In the ion doping apparatus, a source gas is excited to generate plasma, ions are extracted from the plasma, and the ions which are not mass-separated are introduced into an object to be processed. With the use of an ion doping apparatus, the single crystal semiconductor substrate 101 can be uniformly doped with the ions. Note that in an ion doping apparatus provided with a mass separator, it is possible to mass separate ion species in plasma and irradiate an object to be processed with ion species having specific mass.

As a gas used for the ion irradiation, a hydrogen gas, a rare gas, or the like can be used, and in this embodiment, a hydrogen gas is preferably used. When a hydrogen gas is used in an ion doping method, ion species which are generated are $H^+$, $H_2^+$ and $H_3^+$, and the single crystal semiconductor substrate 101 is preferably irradiated with the largest number of $H_3^+$ among $H^+$, $H_2^+$ and $H_3^+$. $H_3^+$ has higher introduction efficiency than $H^+$ or $H_2^+$, so that introduction time can be reduced. Moreover, a crack is easily generated in a separation layer in a later step.

Next, the supporting substrate 111 is prepared (FIG. 1C). As the supporting substrate 111, a substrate formed of an insulator is used. Specifically, various glass substrates used in the electronics industry, such as substrates formed aluminosilicate glass, aluminoborosilicate glass, and barium borosilicate glass can be given, as well as a quartz substrate, a ceramic substrate, a sapphire substrate, and the like. In this embodiment, the case of using a glass substrate is described. By using a glass substrate which can have a large area and is inexpensive as the supporting substrate 111, the cost can be reduced as compared to the case of using a silicon wafer.

Note that when the supporting substrate 111 is used, a surface of the supporting substrate 111 is preferably cleaned in advance. Specifically, ultrasonic cleaning is performed on the supporting substrate 111 using a hydrochloric acid/hydrogen peroxide mixture (HPM), a sulfuric acid/hydrogen peroxide mixture (SPM), an ammonium hydroxide/hydrogen peroxide mixture (APM), diluted hydrogen fluoride (DHF), ozone water, or the like. For example, ultrasonic cleaning is preferably performed on the surface of the supporting substrate 111 using a hydrochloric acid/hydrogen peroxide mixture. By such a cleaning treatment, the surface of the supporting substrate 111 can be planarized and abrasive particles remaining on the surface can be removed.

Next, the single crystal semiconductor substrate 101 provided with the insulating film 102 and the embrittlement region 103 and the supporting substrate 111 are cleaned. This cleaning step can be performed by ultrasonic cleaning in pure water. The ultrasonic cleaning is preferably megahertz ultrasonic cleaning (megasonic cleaning). After the ultrasonic cleaning, it is preferable that one of or both the single crystal semiconductor substrate 101 and the supporting substrate 111 be cleaned with ozone-containing water. By cleaning with ozone-containing water, an organic substance can be removed and a surface activation treatment can be performed to improve hydrophilicity of a surface of the insulating film 102 and the supporting substrate 111. Other than ozone-containing water, a cleaning treatment may be performed with oxygen-containing water, hydrogen-containing water, pure water, or the like. Through such a cleaning treatment, the bonding surface can be made hydrophilic and the number of OH groups on the bonding surface can be increased. Increase of OH groups can lead to a further strengthened bond by hydrogen bonding.

The activation treatment of the surface of the insulating film 102 and the supporting substrate 111 can be performed through irradiation with an atomic beam or an ion beam, a plasma treatment, or a radical treatment as well as cleaning with ozone-containing water. In the case of using an atomic beam or an ion beam, an inert gas neutral atom beam or an inert gas ion beam of argon or the like can be used. Such a surface treatment facilitates bonding between different kinds of materials even at a temperature of equal to or less than 400° C.

Figure 1D:
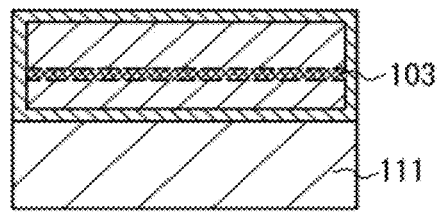

Next, the surface of the single crystal semiconductor substrate 101 and the surface of the supporting substrate 111 are made to face each other and the surface of the insulating film 102 and the supporting substrate 111 are bonded (FIG. 1D). By bonding the insulating film 102 and the supporting substrate 111, the substrates attract each other by van der Waals forces. Then, a pressure of about 300 N/cm² to 15000 N/cm² is applied to one part of the edge of the single crystal semiconductor substrate 101. A pressure applied thereto is preferably from 1000 N/cm² to 5000 N/cm². Si—OH on the surfaces of the insulating film 102 and Si—OH on the surface of the supporting substrate are bonded to each other by hydrogen bonding in the pressurized part, and the bonded part extends to the substantially whole plane of the insulating film 102. As a result, the single crystal semiconductor substrate 101 is bonded to the supporting substrate 111. This bonding step can be performed at room temperature without a heat treatment; therefore, a substrate having low heat resistance and having an upper temperature limit of equal to or less than 700° C., such as a glass substrate, can be used as the supporting substrate 111.

After the supporting substrate 111 is bonded to the single crystal semiconductor substrate 101, it is preferable to perform a heat treatment to increase the bonding force at the bonding interface between the supporting substrate 111 and the insulating film 102. This treatment is performed at a temperature at which the embrittlement region 103 does not crack; specifically, the temperature is in the range of equal to or greater than 200° C. and equal to or less than 450° C. By performing the heat treatment at such a temperature range, a dehydration condensation reaction occurs to form a bond (Si—O—Si) from which a water molecule is released and in which an oxygen atom is present between silicon atoms. Therefore, the bonding force at the bonding interface between the supporting substrate 111 and the insulating film 102 can be increased.

Figure 1E:
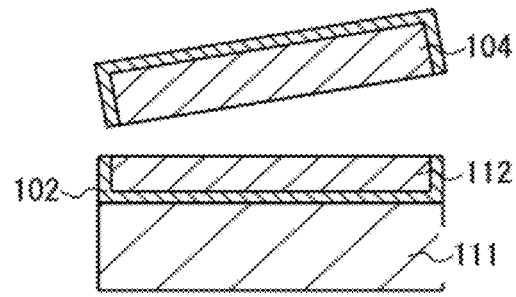

Next, a heat treatment is performed so that the single crystal semiconductor substrate 101 is separated (also referred to as cleaved or divided) in the embrittlement region 103 into the supporting substrate to which the single crystal semiconductor layer is bonded and part of the single crystal semiconductor substrate. FIG. 1E illustrates a step in which the single crystal semiconductor layer 112 is separated from the single crystal semiconductor substrate 101.

By the heat treatment, an H atom added by the ion doping is precipitated as a gas in microvoids which are formed in the embrittlement region 103 due to increase in temperature, so that excessive H atoms become a $H_2$ gas, whereby internal pressure of the microvoids increases. Due to increase in pressure, the volume of the microvoids in the embrittlement region 103 changes to generate a crack in the embrittlement region 103. Accordingly, a separated plane for separating the single crystal semiconductor substrate 101 is generated in the embrittlement region 103. Because the insulating film 102 is bonded to the supporting substrate 111, the single crystal semiconductor layer 112 which is separated from the single crystal semiconductor substrate 101 is fixed to the supporting substrate 111. The heat treatment for separating the single crystal semiconductor layer 112 from the single crystal semiconductor substrate 101 is performed at a temperature which does not exceed a strain point of the supporting substrate 111.

For the heating treatment, an RTA (rapid thermal anneal) apparatus, a resistance heating furnace, or a microwave heating apparatus can be used. As an RTA apparatus, a GRTA (gas rapid thermal anneal) apparatus or an LRTA (lamp rapid thermal anneal) apparatus can be used. It is preferable that the temperature of the supporting substrate 111 to which the single crystal semiconductor layer 112 is attached be increased to be in the range of equal to or greater than 550° C. and equal to or less than 650° C. by this heat treatment.

In this manner, the heat treatment is performed to separate the single crystal semiconductor substrate in the embrittlement region 103, whereby the single crystal semiconductor layer 112 can be provided over the supporting substrate 111 with the insulating film 102 interposed therebetween (FIG. 1E). In addition, by reusing a single crystal semiconductor substrate 104 from which the single crystal semiconductor layer 112 is separated, the manufacturing cost can be reduced. Since the heat treatment process illustrated in FIG. 1E can be performed at a relatively low temperature of equal to or less than 700° C., damage to the single crystal semiconductor substrate 101 due to heat can be suppressed. Thus, such a heat treatment process is effective in reusing the single crystal semiconductor substrate 101.

By the foregoing steps, an SOI substrate in which the single crystal semiconductor layer 112 is provided over the supporting substrate 111 with the insulating film 102 interposed therebetween can be manufactured.

Figure 2A:
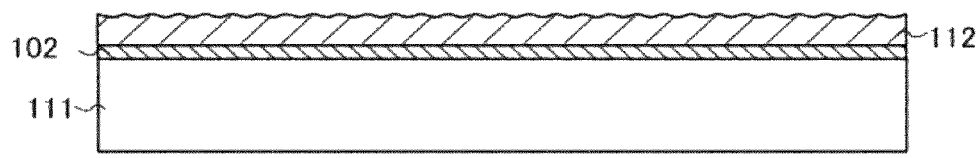
FIGS. 2A to 2D illustrate a method for manufacturing an SOI substrate according to Embodiment 1.

As for the single crystal semiconductor layer 112 of FIG. 2A, the planarity of a surface of the single crystal semiconductor layer 112 deteriorates due to an ion addition step for forming the embrittlement region 103 or a separation step. For example, crystal defects remain in the single crystal semiconductor layer 112 and the embrittlement region 103 or damage remains on the surface of the single crystal semiconductor layer 112. Further, if the separation of the single crystal semiconductor layer 112 is not smoothly performed, there arise problems such as a rough surface, variation in thickness, and generation of minute chinks of the single crystal semiconductor layer 112. It is difficult to form a gate insulating layer which is thin and has high withstand voltage on such a surface of the single crystal semiconductor layer 112 with low planarity. Further, in the case where crystal defects are in the single crystal semiconductor layer 112, performance and reliability of transistors may adversely be affected, for example, a localized level density at the interface with the gate insulating layer increases. Note that surface unevenness of the single crystal semiconductor layer 112 of FIG. 2A only schematically illustrates a rough surface and poor planarity, and the actual shape is not limited thereto.

Therefore, a treatment for increasing the planarity of the single crystal semiconductor layer 112 and reducing crystal defects thereof is performed. The treatment for increasing the planarity of the single crystal semiconductor layer 112 and reducing crystal defects thereof can be performed by one of an etching treatment and irradiation with laser light or a combination thereof. For example, laser irradiation may be performed after one of dry etching and wet etching (etch-back treatment) or a combination thereof is performed. With such a treatment, reduction of crystal defects in and on the surface of the single crystal semiconductor layer 112 and planarization of the surface of the single crystal semiconductor layer 112 can be achieved.

By performing an etching treatment on the surface of the single crystal semiconductor layer 112, the surface of the single crystal semiconductor layer 112 is removed (not illustrated). By removing the surface of the single crystal semiconductor layer 112, the embrittlement region 103 that remains on the surface of the single crystal semiconductor layer 112 and the damage caused at the separation or the like can be removed. Since the size or depth of the defect existing in the single crystal semiconductor layer 112 depends on the amount of energy or dosage of ions which are added, the thickness of the surface of the single crystal semiconductor layer 112, which is removed by the etching treatment, may be set as appropriate depending on the thickness and surface roughness of the single crystal semiconductor layer 112 before the etching treatment.

As the dry etching method which is performed on the surface of the single crystal semiconductor layer 112, for example, a reactive ion etching (RIE) method, an inductively coupled plasma (ICP) etching method, an electron cyclotron resonance (ECR) etching method, a parallel plate (capacitive coupled plasma) etching method, a magnetron plasma etching method, a dual-frequency plasma etching method, a helicon wave plasma etching method, or the like can be used. Etching can be performed using, for example, a chlorine-based gas such as $Cl_2$, $BCl_3$, or $SiCl_4$; a fluorine-based gas such as $CHF_3$, $CF_4$, $C_4F_8$, $C_2F_6$, $NF_3$, or sulfur fluoride; a boron-based gas such as HBr; or an inert gas such as He, Ar, or Xe as an etching gas. Further, an $O_2$ gas or an $H_2$ gas can also be combined with any of the above gases to perform the etching.

By performing the etching treatment on the surface of the single crystal semiconductor layer 112, the embrittlement region 103 that remains on the surface of the single crystal semiconductor layer 112 and the damage caused at the separation or the like can be removed. In addition, the embrittlement region 103 that remains on the surface of the single crystal semiconductor layer 112 and the damage caused at the separation or the like are removed, whereby the surface roughness of the single crystal semiconductor layer 112 can be reduced.

Although the case where dry etching is performed is described in this embodiment, wet etching can also be performed. Further, in the case of performing wet etching, an aqueous solution of 2.38% of tetramethylammonium hydroxide (abbreviation: TMAH) can be used as an etchant.

Figure 2B:
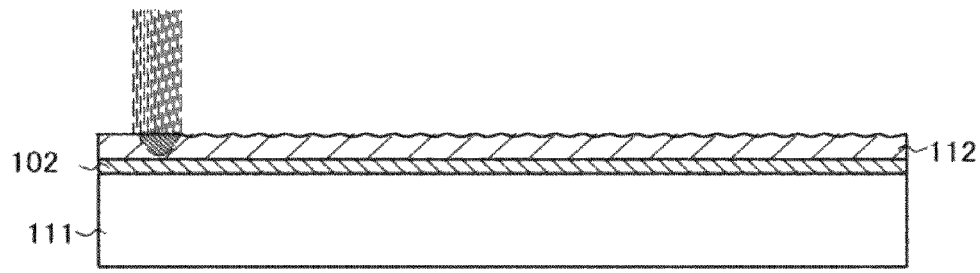

Next, as illustrated in FIG. 2B, the single crystal semiconductor layer 112 subjected to the etching treatment is irradiated with laser light. There are generated crystal defects in the single crystal semiconductor layer 112 due to the ion addition step for forming the embrittlement region 103. Further, there is the case where minute chinks occur in the single crystal semiconductor layer 112 because smooth separation for releasing the single crystal semiconductor layer 112 from the single crystal semiconductor substrate 101 has not been performed. By irradiation of the single crystal semiconductor layer 112 with laser light, the single crystal semiconductor layer 112 can be melted. By melting the single crystal semiconductor layer 112, crystal defects, minute chinks, or the like generated in the single crystal semiconductor layer 112 can be eliminated.

It is preferable that the single crystal semiconductor layer 112 be partially melted by the laser irradiation. The phrase "partially melted state" refers to a state in which an upper part of the single crystal semiconductor layer 112 is melted to be liquid while a lower part thereof is not melted to remain solid. When the temperature of a melt is set to be lower than the melting point after the single crystal semiconductor layer 112 is in the partially melted state, atoms on the melt side are attached to a seed crystal at an interface between a solid phase part (seed crystal) of the single crystal semiconductor layer 112 which is not melted and a liquid phase part (melt) of the single crystal semiconductor layer 112 which is melted, whereby a crystal grows. The melted crystal grows in the above manner, whereby unevenness of the surface as well as crystal defects in the single crystal semiconductor layer 112 can be reduced.

Since the supporting substrate 111 is not directly heated by reducing crystal defects and unevenness of the surface of the single crystal semiconductor layer 112 using laser light in such a manner, increase in temperature of the supporting substrate 111 can be suppressed. Therefore, crystal defects and the unevenness of the surface can be reduced sufficiently even in the case where the supporting substrate 111 having low heat resistance is used.

The single crystal semiconductor layer 112 is preferably thinned in accordance with characteristics of the element formed using the single crystal semiconductor layer 112 after the single crystal semiconductor layer 112 is irradiated with laser light. In order to form a thin gate insulating layer with favorable step coverage on the surface of the single crystal semiconductor layer 112 which is bonded to the supporting substrate 111, the single crystal semiconductor layer 112 preferably has a thickness of equal to or less than 60 nm, specifically equal to or greater than 5 nm and equal to or less than 60 nm. For thinning of the single crystal semiconductor layer, one of dry etching and wet etching, or an etching treatment (an etch-back treatment) in which both dry etching and wet etching are combined may be performed. For example, when the single crystal semiconductor layer is a layer formed using a silicon material, the single crystal semiconductor layer can be thinned by dry etching using $SF_6$ and $O_2$ as a process gas.

Figure 2C:
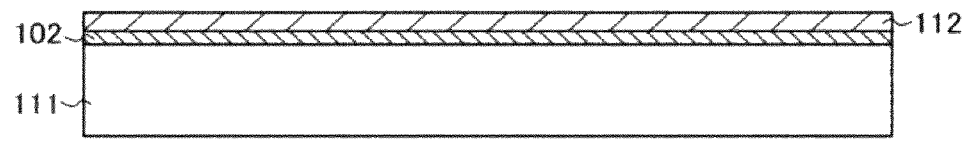

Next, a plasma treatment is performed in order to eliminate defects of the single crystal semiconductor layer 112 which have not been repaired in the laser irradiation, and alleviate distortion and repair dangling bonds of the single crystal semiconductor layer 112 (FIG. 2C). When there are remains of defects, distortion, or the like remains in the single crystal semiconductor layer 112, larger defects are generated and thus characteristics of an element are adversely affected during a process at the time of manufacturing an element, particularly a thermal process. Therefore, defects, distortion, or the like of the single crystal semiconductor layer 112 need to be repaired. Note that defects, distortion, or the like of the single crystal semiconductor layer 112 can be repaired by performing a heat treatment at a temperature of equal to or greater than 1000° C.; however, such a high-temperature process cannot be used to repair defects, distortion, or the like of the single crystal semiconductor layer 112 bonded to the supporting substrate having low heat resistance.

Thus, according to one embodiment of the present invention, the plasma treatment is performed for elimination of defects, alleviation of distortion, or the like of the single crystal semiconductor layer 112 (FIG. 2C). The plasma treatment can be performed by introducing a gas containing water (typically water vapor ($H_2O$ vapor)) as its main component into a reaction space and generating plasma. By making the water vapor into a plasma state, an oxygen atom, a hydrogen atom, or an $H_2O$ excited molecule and further a neutral atom having high activity, such as an OH free radical, are generated. Gases used for the plasma treatment are not limited as long as OH free radicals are generated when the gases are made into a plasma state, and hydrogen peroxide ($H_2O_2$) can also be used in addition to the gas containing water (typically water vapor ($H_2O$ vapor)) as its main component.

The plasma treatment using the water vapor is performed after the etching, whereby OH free radicals act on defects, distortion, damage, or dangling bonds, so that defects, dangling bonds, or the like can be repaired with the OH free radicals.

A method for generating plasma is not particularly limited, and an inductively coupled plasma (ICP) method, a capacitively coupled plasma (parallel plate type) (CCP) method, an electron cyclotron resonance (ECR) method, a helicon method, or the like can be applied. In addition, the plasma treatment is preferably performed within a temperature range of equal to or greater than 100° C. and equal to or less than 280° C., preferably within a temperature range of equal to or greater than 220° C. and equal to or less than 280° C. This is because OH radicals by which dangling bonds of the single crystal semiconductor layer 112 are terminated are eliminated, and the termination of the dangling bonds is interrupted, if the temperature of the plasma treatment is too high.

Figure 3:
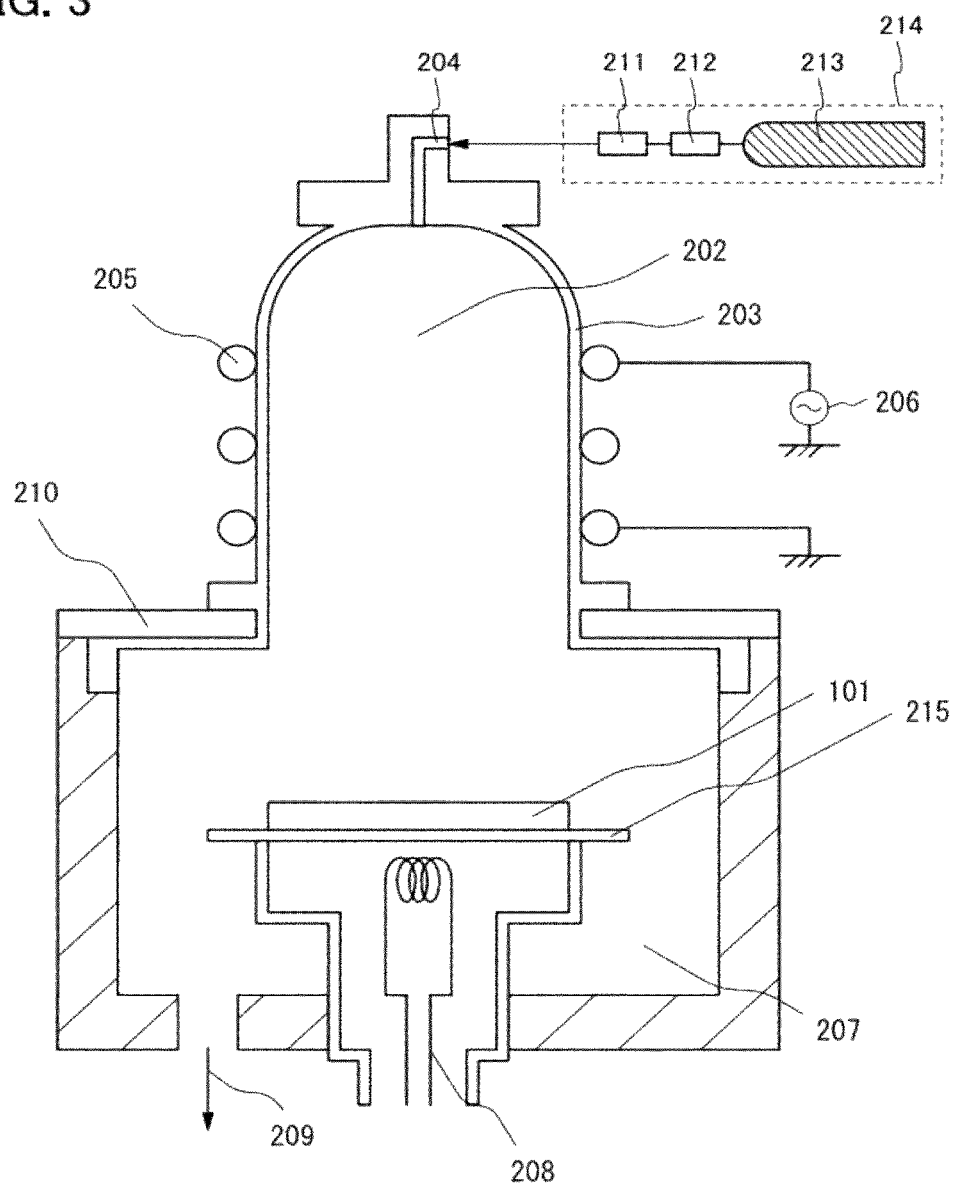
FIG. 3 is a general structural diagram showing an example of a plasma treatment apparatus.

FIG. 3 illustrates a general structural diagram showing an example of a plasma treatment apparatus used in this embodiment. In this embodiment, a so-called down-flow ICP plasma treatment apparatus in which a sample is disposed in a plasma atmosphere existing on the downstream side of a plasma generation chamber is used.

On the upper portion of a vacuum case 210 included in the main body of the plasma treatment apparatus, a discharge tube 203 inside of which a plasma generation chamber 202 is formed is provided. For example, a process-gas introduction tube 204 is provided at the top of the discharge tube 203 made of quartz. A gas supply unit 214 is connected to the process-gas introduction tube 204. The gas supply unit 214 includes a mass flow controller 211, vaporizer 212, a cylinder 213, and the like. A process gas is introduced through the process-gas introduction tube 204 into the plasma generation chamber 202.

On the outer portion of the discharge tube 203, a discharge coil 205 for exciting plasma in the plasma generation chamber 202 is spirally wrapped around. In order to supply power to the discharge coil 205, the discharge coil 205 is connected to one terminal of a high-frequency (radio frequency) power source 206 (hereinafter referred to as an RF power source). Therefore, power with a high frequency of 100 kHz to 100 MHz, for example, about 13.56 MHz is supplied to the discharge coil 205 by the RF power source 206. The other terminal of the RF power source 206 is connected to ground.

A down flow chamber 207 is formed under the vacuum case 210, that is, below the plasma generation chamber 202. In this down flow chamber 207, a stage 215 for supporting the sample is provided and plasma is introduced from the plasma generation chamber 202. Into the stage 215 which holds a substrate with the single crystal semiconductor layer faced upward, a heater 208 for heating this substrate so that the plasma treatment is promoted is incorporated. In order to set the pressure in the vacuum case 201 at a pressure as low as about 1.0 Pa, an exhaust outlet 209 is provided by forming an opening in the lower wall of the down flow chamber 207 and connected to a vacuum pump which is not illustrated.

Since the sample is spaced from the region where plasma is generated in such a down-flow plasma treatment apparatus, plasma damage to the sample due to plasma treatment is preferably suppressed.

Next, an example of the method for performing a plasma treatment on a substrate with the use of the above plasma treatment apparatus is described below.

First, the temperature of the stage 215 is set at 250° C. by the heater 208 to heat a substrate. The pressure of the chamber is set at 66.5 Pa and an RF (13.56 MHz) power of 1800 W is applied to the coil electrode so that plasma is generated, and power is applied to the substrate side. Subsequently, pure water is supplied from the cylinder 213 and vaporized by the vaporizer 212, so that water vapor at a flow rate of 300 sccm is introduced into the plasma generation chamber 202. In the plasma generation chamber 202, water vapor is made to be plasma by a microwave. Then, the plasma water vapor is introduced into the down-flow chamber 207 in the downstream of the gas, and the plasma water vapor is supplied to the single crystal semiconductor layer 112 on the stage 215 of the down-flow chamber 207. The supply of such plasma water vapor is performed for 180 seconds.

By exposing plasma including OH free radicals after the etching, crystal defects can be reduced. In addition, as compared to the case where a heat treatment is performed at a temperature of about 600° C., it does not take much time to reduce crystal defects, and thus the time taken for the whole manufacturing process of an SOI substrate can be reduced.

In addition, after the plasma treatment is performed, a heat treatment at a temperature of equal to or greater than 500° C. and equal to or less than 700° C. can also be performed. In this case, since there is reduction of defects, distortion, or damage by the plasma treatment, the time taken for the whole manufacturing process of an SOI substrate can be reduced as compared to the case where only the heat treatment is performed. In addition, the heat treatment can also be performed before the plasma treatment. For the heating treatment, an RTA (rapid thermal anneal) apparatus, a resistance heating furnace, or a microwave heating apparatus can be used. For the RTA apparatus, an RTA apparatus of a gas heating method using a heated gas (a gas rapid thermal anneal (GRTA) apparatus) or an RTA apparatus of a lamp heating method (a lamp rapid thermal anneal (LRTA) apparatus) can be used. For example, when a resistance heating furnace is used, a heat treatment may be performed at 600° C. for 4 hours.

Figure 2D:
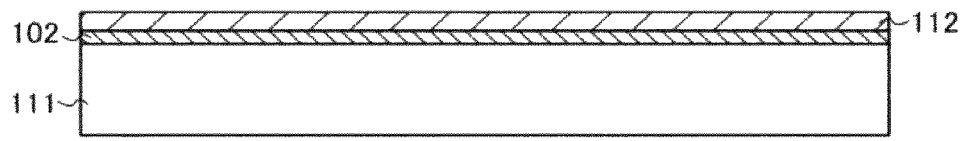

By the foregoing steps, an SOI substrate in which the single crystal semiconductor layer is provided over the supporting substrate with the insulating film interposed therebetween can be manufactured (FIG. 2D). Even when a supporting substrate having low heat resistance is used, the planarity can be increased and crystal defects can be reduced sufficiently by the manufacturing method described in this embodiment. In addition, an SOI substrate having excellent planarity and crystallinity can be manufactured with high yield. Moreover, a semiconductor device having excellent characteristics can be manufactured using such an SOI substrate.

This embodiment can be freely combined with any of other embodiments.

Embodiment 2

In this embodiment, an SOI substrate having a structure different from that shown in Embodiment 1 will be described. Note that in this embodiment, portions similar to those in Embodiment 1 are denoted by the same reference numerals, and detailed descriptions thereof are omitted.

Figure 4A:
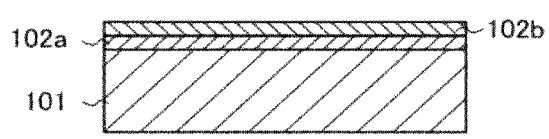
FIGS. 4A to 4F illustrate a structure of an SOI substrate according to Embodiment 2.
Figure 4D:

An example of a method for manufacturing an SOI substrate according to this embodiment will be illustrated in FIGS. 4A to 4F. First, as illustrated in FIG. 4A, an insulating film 102 having a two-layer structure of an insulating film 102a and an insulating film 102b is formed over the single crystal semiconductor substrate 101. In the case of forming the insulating film 102 with a two-layer structure, the insulating film 102 preferably includes one barrier layer. In the case of forming the insulating film 102 with a two-layer structure, a barrier layer for blocking impurities such as sodium is formed as the upper insulating film. The upper insulating film can be formed using a silicon nitride film, a silicon nitride oxide film, an aluminum nitride film, or an aluminum nitride film with a thickness of equal to or greater than 5 nm and equal to or less than 200 nm. These films that each serve as a barrier layer have a high blocking effect for preventing impurity diffusion, but their internal stress is also high. Therefore, as the lower insulating film which is in contact with the single crystal semiconductor substrate 101, a film with an effect of relieving the stress of the upper insulating film is preferably selected. As such a lower insulating film, a silicon oxide film, a silicon oxynitride film, a thermally-oxidized film obtained by thermally oxidizing the single crystal semiconductor substrate 101, or the like is used. The thickness of the lower insulating film can be equal to or greater than 5 nm and equal to or less than 200 nm.

As a combination of the insulating film 102a and the insulating film 102b with which the insulating film 102 functions as a barrier layer, for example, the following combinations are given: a silicon oxide film and a silicon nitride film; a silicon oxynitride film and a silicon nitride film; a silicon oxide film and a silicon nitride oxide film; a silicon oxynitride film and a silicon nitride oxide film; and the like.

For example, the lower insulating film 102a can be formed using a silicon oxynitride film which is formed by a PECVD method using $SiH_4$ and $N_2O$ as a process gas. Alternatively, as the insulating film 102a, a silicon oxide film can be formed by a PECVD method using organosilane and oxygen as a process gas. Further alternatively, the insulating film 102a can be formed using an oxide film formed by oxidizing the single crystal semiconductor substrate 101.

As examples of the organosilane, the following compounds can be given: tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), trisdimethylaminosilane (chemical formula: $SiH(N(CH_3)_2)_3$), and the like.

Alternatively, the upper insulating film 102b can be formed of a silicon nitride oxide film formed by a PECVD method using $SiH_4$, $N_2O$, $NH_3$, or $H_2$ as a process gas or a silicon nitride film formed by a PECVD method using $SiH_4$, $N_2$, $NH_3$, or $H_2$ as a process gas.

As illustrated in FIG. 4A, in the case of forming a silicon oxynitride film and a silicon nitride oxide film as the insulating film 102a and the insulating film 102b, respectively, the single crystal semiconductor substrate 101 is transferred into a chamber of a PECVD apparatus, $SiH_4$ and $N_2O$ are supplied to the chamber as a process gas for forming the insulating film 102a, plasma of a mixed gas of this process gas is generated, and a silicon nitride oxide film is formed over the single crystal semiconductor substrate 101. Then, the process gas supplied to the chamber is changed to a process gas for forming the insulating film 102b. Here, SiH$_4$, N$_2$O, NH$_3$, and N$_2$O are used. Plasma of a mixed gas of those gases is generated to form the silicon oxynitride film and the silicon nitride oxide film successively. In the case of using a PECVD apparatus with a plurality of chambers, the silicon oxynitride film and the silicon nitride oxide film can be formed in different chambers. Needless to say, if the process gases supplied to the chamber are changed, a silicon oxide film can be formed as the lower insulating film 102a and a silicon nitride film can be formed as the upper insulating film 102b.

By thus forming the insulating film 102a and the insulating film 102b, the insulating film 102 can be formed over the single crystal semiconductor substrate 101 with high throughput. Further, since the insulating film 102a and the insulating film 102b can be formed without being exposed to air, the interface between the insulating film 102a and the insulating film 102b can be prevented from being contaminated by air.

Further, as the insulating film 102a, an oxide film formed by subjecting the single crystal semiconductor substrate 101 to an oxidation treatment can also be used as shown in Embodiment 1 (FIG. 1A). The thermal oxidation treatment for forming this oxide film can be dry oxidation, in which a gas containing a halogen element is preferably added to an oxidation atmosphere. As the thermal oxidation method under an atmosphere containing a halogen element, the method illustrated in FIG. 1A may be used; thus, detailed descriptions thereof are omitted.

In this specification, the oxynitride refers to a substance which contains more oxygen atoms than nitrogen atoms, whereas the nitride oxide refers to a substance which contains more nitrogen atoms than oxygen atoms. Note that a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 atomic % to 70 atomic %, 0.5 atomic % to 15 atomic %, 25 atomic % to 35 atomic %, and 0.1 atomic % to 10 atomic %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 atomic % to 30 atomic %, 20 atomic % to 55 atomic %, 25 atomic % to 35 atomic %, and 10 atomic % to 30 atomic %, respectively. Note that percentages of nitrogen, oxygen, silicon, and hydrogen fall within the ranges given above, where the total number of atoms contained in the silicon oxynitride film or the silicon nitride oxide film is defined as 100 atomic %.

Figure 4B:
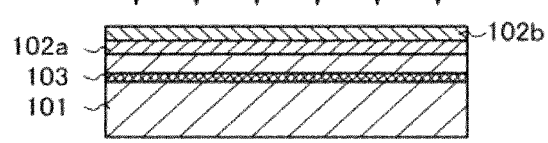

Next, as illustrated in FIG. 4B, through the insulating film 102, the single crystal semiconductor substrate 101 is irradiated with ions, whereby the ions are introduced into the single crystal semiconductor substrate 101; accordingly, an embrittlement region 103 is formed in a region at a predetermined depth from one surface of the single crystal semiconductor substrate 101. As the method for forming the embrittlement region 103, the method illustrated in FIG. 1B may be used; thus, detailed descriptions thereof are omitted.

Figure 4C:
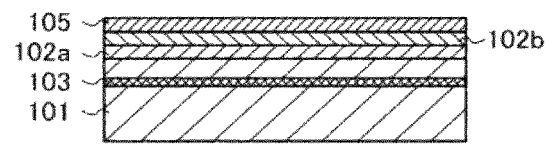

Next, as illustrated in FIG. 4C, after the embrittlement region 103 is formed, an insulating film 105 is formed over the insulating film 102b. At the time of forming the insulating film 105, the heating temperature of the single crystal semiconductor substrate 101 is a temperature at which the atom or the molecule which is added to the embrittlement region 103 is not precipitated, and the heating temperature is preferably equal to or less than 350° C., for example. In other words, at this heating temperature, the gas is not released from the embrittlement region 103. Note that the insulating film 105 can also be formed before formation of the embrittlement region 103. The process temperature when the insulating film 105 is formed before formation of the embrittlement region 103 can be equal to or greater than 350° C.

The insulating film 105 is a layer for forming a bonding surface, which is smooth and hydrophilic, on a surface of the single crystal semiconductor substrate 101. The average surface roughness R$_a$ of the insulating film 105 is preferably equal to or less than 0.7 nm, more preferably equal to or less than 0.4 nm. The thickness of the insulating film 105 can be equal to or greater than 10 nm and equal to or less than 200 nm, preferably equal to or greater than 5 nm and equal to or less than 500 nm, and more preferably equal to or greater than 10 nm and equal to or less than 200 nm.

As the insulating film 105, an insulating film which is formed by a chemical vapor reaction is preferable. For example, a silicon oxide film, a silicon oxynitride film, a silicon nitride oxide film, a silicon nitride film, or the like can be formed as the insulating film 105. In the case of forming a silicon oxide film by a PECVD method as the insulating film 105, it is preferable to use an organosilane gas and an oxygen (O$_2$) gas for a source gas. By using organosilane as the source gas, it is possible to form a silicon oxide film having a flat surface at a process temperature of equal to or less than 350° C. Alternatively, the insulating film 105 can be formed using a low temperature oxide (LTO) which is formed by a thermal CVD method at a heating temperature of equal to or greater than 200° C. and equal to or less than 500° C. LTO can be formed by using monosilane (SiH$_4$), disilane (Si$_2$H$_6$), or the like as a silicon source gas and using dinitrogen monoxide (N$_2$O) or the like as an oxygen source gas.

For example, the condition example for forming the insulating film 105 of a silicon oxide film using TEOS and O$_2$ for a source gas is such that TEOS is introduced into a treatment chamber at a flow rate of 15 sccm and O$_2$ is introduced at a flow rate of 750 sccm. A film formation pressure can be 100 Pa, a film formation temperature can be 300° C., an RF power output can be 300 W, and a power frequency can be 13.56 MHz.

In addition, after the single crystal semiconductor substrate 101 is irradiated with ions to form the embrittlement region 103, the insulating film 102 and the insulating film 105 can also be formed. In this case, it is preferable to form the insulating film 102 and the insulating film 105 successively in the case where the insulating film 102 and the insulating film 105 can be formed with the same film formation apparatus.

Figure 4E:
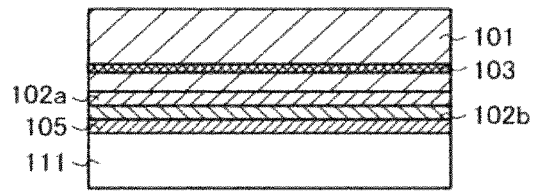
Figure 4F:
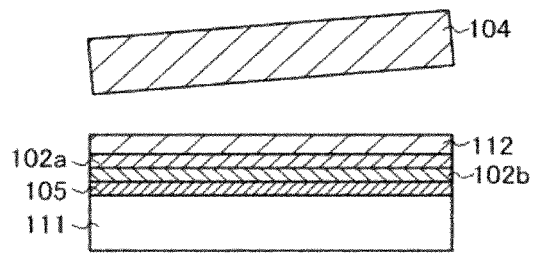

Next, the single crystal semiconductor substrate 101, in which the insulating film 102 and the insulating film 105 are formed on its surface and the embrittlement region 103 is formed in a region at a predetermined depth from the surface, and the supporting substrate 111 are bonded to each other with the insulating film 102 and the insulating film 105 interposed therebetween (FIG. 4E). Then, by separating the single crystal semiconductor substrate 101 in the embrittlement region 103 by a heat treatment, a single crystal semiconductor layer 112 can be formed over the supporting substrate 111 with the insulating film 105 and the insulating film 102 interposed therebetween (FIG. 4F). Next, after a treatment for increasing planarity and reducing crystal defects is performed on the single crystal semiconductor layer 112, a treatment for further reducing crystal defects by exposure to plasma including OH free radicals is performed, so that the single crystal semiconductor layer 112 having preferable planarity and crystallinity can be formed. As the methods of the foregoing steps, the methods shown in Embodiment 1 (FIGS. 1D and 1E and FIGS. 2A to 2C) may be used; thus, detailed descriptions thereof are omitted.

As described above, the insulating film 102 is formed with a two-layer structure, where the upper insulating film 102b is a barrier layer, whereby impurities such as sodium from the supporting substrate 111 can be blocked. In addition, the insulating film 105 having a surface which is smooth and hydrophilic is formed over the insulating film 102b, whereby the single crystal semiconductor substrate 101 can be attached to the supporting substrate 111 preferably.

Figure 5:
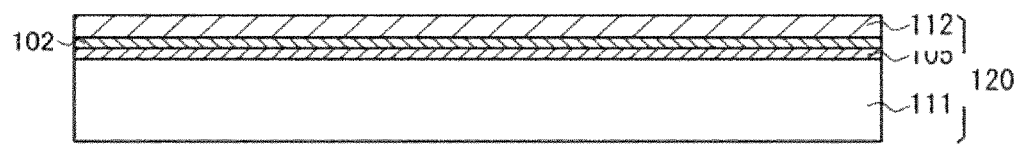
FIG. 5 illustrates a structure of an SOI substrate according to Embodiment 2.

A structure in which the single crystal semiconductor layer 112 is formed over the supporting substrate 111 with an insulating film 105 and an insulating film 102 interposed therebetween is illustrated in FIG. 5. For example, the insulating film 102 can be formed using a silicon oxynitride film which is formed by a PECVD method using $SiH_4$ and $N_2O$ as a process gas. Alternatively, as the insulating film 102, a silicon oxide film can be formed by a PECVD method using organosilane and oxygen as a process gas. Further alternatively, an oxide film which is formed by performing an oxidation treatment on the single crystal semiconductor substrate 101 under an oxidation atmosphere containing a halogen element can be used as the insulating film 102. As the insulating film 105, a film which functions as a barrier layer is used. The insulating film 105 can be formed using a silicon nitride film, a silicon nitride oxide film, an aluminum nitride film, or an aluminum nitride oxide film with a thickness of equal to or greater than 5 nm and equal to or less than 200 nm.

Next, a method for manufacturing an SOI substrate illustrated in FIG. 5 is described. First, the insulating film 102 is formed over the single crystal semiconductor substrate 101. Next, through the insulating film 102, the single crystal semiconductor substrate 101 is irradiated with ions, whereby the ions are introduced into the single crystal semiconductor substrate; accordingly, an embrittlement region 103 is formed in a region at a predetermined depth from one surface of the single crystal semiconductor substrate 101. As the method for forming the embrittlement region 103, the method illustrated in FIG. 1B may be used; thus, detailed descriptions thereof are omitted.

After the embrittlement region 103 is formed, the insulating film 105 is formed over the insulating film 102. At the time of forming the insulating film 105, the heating temperature of the single crystal semiconductor substrate 101 is a temperature at which the atom or the molecule which is added to the embrittlement region 103 is not precipitated, and the heating temperature is preferably equal to or less than 350° C., for example. In other words, at this heating temperature, the gas is not released from the embrittlement region 103. The insulating film 105 is formed at a temperature of equal to or less than 350° C., whereby the insulating film 105 can have a surface which is smooth and hydrophilic. In addition, the insulating film 105 is formed as a barrier layer, whereby impurities such as sodium from the supporting substrate 111 can be blocked.

Next, the single crystal semiconductor substrate 101, in which the insulating film 102 and the insulating film 105 are formed on its surface and the embrittlement region 103 is formed in a region at a predetermined depth from the surface, and the supporting substrate 111 are bonded to each other with the insulating film 102 and the insulating film 105 interposed therebetween. Then, by separating the single crystal semiconductor substrate 101 in the embrittlement region 103 by a heat treatment, a single crystal semiconductor layer 112 can be formed over the supporting substrate 111 with the insulating film 105 and the insulating film 102 interposed therebetween. Next, after a treatment for increasing planarity and reducing crystal defects is performed on the single crystal semiconductor layer 112, a treatment for further reducing crystal defects by exposure to plasma including OH free radicals is performed, so that the single crystal semiconductor layer 112 having preferable planarity and crystallinity can be formed. The methods shown in Embodiment 1 (FIGS. 1D and 1E and FIGS. 2A to 2C) may be used as methods of the foregoing steps; thus, detailed descriptions thereof are omitted.

As described above, since the insulating film 105 functions as a barrier layer by having the structure illustrated in FIG. 5, the single crystal semiconductor layer 112 can be prevented from being contaminated by diffusion of impurities into the single crystal semiconductor layer 112 from the supporting substrate 111.

Figure 6:
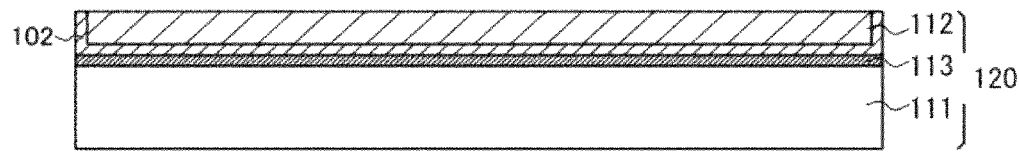
FIG. 6 illustrates a structure of an SOI substrate according to Embodiment 2.

A structure in which the single crystal semiconductor layer 112 is formed over the supporting substrate 111 with an insulating film 113 and an insulating film 102 interposed therebetween is illustrated in FIG. 6. As the insulating film 102, an oxide film which is formed on the surface of the single crystal semiconductor substrate 101 can be used as shown in Embodiment 1. As the insulating film 113, an oxide film or a nitride film containing one or a plurality of elements selected from aluminum, magnesium, strontium, titanium, tantalum, zirconium, or yttrium can be used. The case where, for example, an oxide film containing aluminum oxide as its main component is used for the insulating film 113 is described. The oxide film containing aluminum oxide as its main component refers to an oxide film in which aluminum oxide is contained at least 10 wt. % where the total amount of all components in the oxide film is 100 wt. %. Alternatively, a film which contains aluminum oxide as its main component and contains one of or both magnesium oxide and strontium oxide can be used as the insulating film 113. Further alternatively, an aluminum oxide film containing nitrogen may be used as the insulating film 113.

Next, a method for manufacturing an SOI substrate illustrated in FIG. 6 is described. First, the insulating film 102 is formed over the single crystal semiconductor substrate 101. Next, through the insulating film 102, the single crystal semiconductor substrate 101 is irradiated with ions, whereby the ions are introduced into the single crystal semiconductor substrate 101; accordingly, an embrittlement region 103 is formed in a region at a predetermined depth from one surface of the single crystal semiconductor substrate 101. As the method for forming the embrittlement region 103, the method illustrated in FIG. 1B may be used; thus, detailed descriptions thereof are omitted.

Next, a planarization treatment using a plasma treatment is performed on a surface of the supporting substrate 111 by applying bias voltage. Here, the planarization treatment is performed in a plasma sate by introducing an inert gas (e.g., an Ar gas) and/or a reactive gas (e.g., an $O_2$ gas or an $N_2$ gas) into a vacuum chamber and applying bias voltage to a surface to be processed (here, the supporting substrate 111). In plasma, electrons and cations of Ar are present, and the cations of Ar are accelerated toward a cathode (toward the supporting substrate 111). The accelerated cations of Ar collide with the surface of the supporting substrate 111 so that the surface of the supporting substrate 111 is sputter etched. In this sputter etching, a projection of the surface of the supporting substrate 111 is preferentially sputter etched, whereby the planarity of the surface of the supporting substrate 111 can be increased. In the case where a reactive gas is introduced, defects which occur due to the sputter etching performed on the surface of the supporting substrate 111 can be repaired.

By performing the planarization treatment on the surface of the supporting substrate 111 by a plasma treatment with application of bias voltage, average surface roughness ($R_a$) is preferably equal to or less than 0.5 nm, more preferably equal to or less than 0.3 nm; and maximum height difference (P–V) is preferably equal to or less than 6 nm, more preferably equal to or less than 3 nm.

Specific conditions can be set as follows: a power used for a treatment is 100 W to 1000 W; a pressure is 0.1 Pa to 2.0 Pa; a gas flow rate is 5 sccm to 150 sccm; and a bias voltage is 200 V to 600 V.

Further, when the above plasma treatment is performed, by performing a precoating treatment on an inner wall of the chamber, a metal used to form the reaction chamber (iron (Fe), nickel (Ni), chromium (Cr), or the like) can be prevented from being attached to the surface of the supporting substrate 111 as impurities. For example, by covering an inner wall of the reaction chamber with an insulating film such as a silicon oxide film, a silicon film, an aluminum oxide film, or a silicon carbide (SiC) film, contamination of the surface of the supporting substrate 111, which accompanies the planarization treatment, can be suppressed.

As described above, by performing the planarization treatment, the planarity of the surface of the supporting substrate 111 can be increased. Even in the case where a substrate polished by CMP or the like is used as the supporting substrate 111, abrasive particles ($CeO_2$ or the like) which remain over the supporting substrate 111 can be removed and the surface of the supporting substrate 111 can be planarized. As a result, planarity of a film which is formed over the supporting substrate 111 can be increased.

Note that the supporting substrate 111 may be cleaned before the planarization treatment is performed on the supporting substrate 111. Specifically, ultrasonic cleaning is performed on the supporting substrate 111 using a hydrochloric acid/hydrogen peroxide mixture (HPM), a sulfuric acid/hydrogen peroxide mixture (SPM), an ammonium hydroxide/hydrogen peroxide mixture (APM), diluted hydrogen fluoride (DHF), ozone water, or the like. For example, ultrasonic cleaning is preferably performed on the surface of the supporting substrate 111 using a hydrochloric acid/hydrogen peroxide mixture. By such a cleaning treatment, the surface of the supporting substrate 111 can be planarized and abrasive particles remaining on the surface can be removed to some extent.

Next, the insulating film 113 is formed over the supporting substrate 111. The insulating film 113 can be formed by a sputtering method. As a material of a target used for a sputtering method, for example, a metal containing aluminum (Al) or metal oxide such as aluminum oxide can be used. Note that a material of a target can be selected as appropriate in accordance with a film to be formed.

In addition, it is preferable that the above planarization treatment and formation of the insulating film 113 by a sputtering method be performed successively without exposure to air. By performing the process successively, throughput can be improved. Further, after the surface of the supporting substrate 111 is planarized by a plasma treatment, the surface of the supporting substrate 111 is activated, and impurities such as an organic substance is likely to attached to the surface of the supporting substrate 111; however, by performing the steps successively, attachment of impurities to the supporting substrate 111 can be suppressed.

In the case where a metal is used for a sputtering target, sputtering is performed while a reactive gas (e.g., oxygen) is introduced (a reactive sputtering method), whereby the insulating film 113 is formed. As the metal, magnesium (Mg); an alloy containing aluminum and magnesium; an alloy containing aluminum and strontium (Sr); or an alloy containing aluminum, magnesium, and strontium can be used other than aluminum. In this case, sputtering may be performed using a direct current (DC) power source or a high-frequency (RF) power source.

For example, sputtering can be performed under the following conditions: aluminum is used as a target; a gas flow rate of argon is 0 sccm to 100 sccm and a gas flow rate of oxygen is 5 sccm to 100 sccm; a deposition pressure is 0.1 Pa to 2.0 Pa; a deposition power is 0.5 kW to 4 kW; and a distance between a target and a substrate (also referred to as a T-S distance) is 50 mm to 185 mm. Note that by performing sputtering using an inert gas (e.g., argon) before formation of the insulating film 113 or by forming a film over a dummy substrate in advance, dust generated when the insulating film 113 is formed over the supporting substrate 111 can be reduced.

In the case where metal oxide is used for a target, by performing sputtering using a high-frequency (RF) power source (an RF sputtering method), the insulating film 113 is formed. As the metal oxide, magnesium oxide; strontium oxide; oxide containing aluminum and magnesium; oxide containing aluminum and strontium; or oxide containing aluminum, magnesium, and strontium can be used other than aluminum oxide.

For example, sputtering can be performed under the following conditions: aluminum is used as a target; a gas flow rate of argon is 0 sccm to 100 sccm and a gas flow rate of oxygen is 5 sccm to 100 sccm; a deposition pressure is 0.1 Pa to 2.0 Pa; a deposition power is 0.5 kW to 4 kW; and a distance between a target and a substrate (also referred to as a T-S distance) is 50 mm to 185 mm.

Alternatively, the insulating film 113 may be formed by a bias sputtering method. In a bias sputtering method, at the same time as deposition from a target, bias voltage is applied to a surface to be processed (here, the supporting substrate 111) and ions are injected into the surface to be processed; thus, the surface to be processed is etched and substances separated from the surface to be processed when the surface to be processed is etched are reattached thereto, at the same time as deposition from a target. Because projections of the surface of the supporting substrate 111 are preferentially etched, the insulating film 113 can be deposited while the surface of the supporting substrate 111 is planarized. Thus, in the case where a bias sputtering method is employed, the planarization treatment which is performed on the supporting substrate 111 before formation of the insulating film 113 may be omitted.

For example, sputtering can be performed under the following conditions: aluminum is used as a target; a gas flow rate of argon is 0 sccm to 100 sccm and a gas flow rate of oxygen is 5 sccm to 100 sccm; a deposition pressure is 0.1 Pa to 2.0 Pa; a deposition power is 0.5 kW to 4 kW; and a distance between a target and a substrate (also referred to as a T-S distance) is 50 mm to 185 mm.

By providing the oxide film containing aluminum oxide as its main component over the supporting substrate 111, impurities such as movable ions and moisture contained in the supporting substrate 111 can be prevented from being diffused into a single crystal semiconductor layer which is to be formed over the supporting substrate 111.

Next, the single crystal semiconductor substrate 101, in which the insulating film 102 is formed on its surface and the embrittlement region 103 is formed in a region at a predetermined depth from the surface, and the supporting substrate 111 are bonded to each other with the insulating film 102 and the insulating film 113 interposed therebetween. Then, by separating the single crystal semiconductor substrate 101 in the embrittlement region 103 by a heat treatment, a single crystal semiconductor layer 112 can be formed over the supporting substrate 111 with the insulating film 113 and the insulating film 102 interposed therebetween. Next, after a treatment for increasing planarity and reducing crystal defects is performed on the single crystal semiconductor layer 112, a treatment for further reducing crystal defects by exposure to plasma including OH free radicals is performed, so that the single crystal semiconductor layer 112 having preferable planarity and crystallinity can be formed. The methods shown in Embodiment 1 (FIGS. 1D and 1E and FIGS. 2A to 2C) may be used as methods of the foregoing steps; thus, detailed descriptions thereof are omitted.

By providing the oxide film containing aluminum oxide as its main component over the supporting substrate 111 as described above, impurities such as movable ions and moisture contained in the supporting substrate 111 can be prevented from being diffused into the single crystal semiconductor layer which is formed over the supporting substrate 111. In addition, since the silicon-based insulating film is provided on the surface to which the single crystal semiconductor substrate 101 is attached and the oxide film containing aluminum oxide as its main component is provided on the surface to which the supporting substrate 111 is attached, bonding between the single crystal semiconductor substrate 101 and the supporting substrate 111 is bonding between the silicon-based insulating film and the insulating film other than the silicon-based insulating film (bonding between different kinds of materials). With the use of such a material, the adhesion between the single crystal semiconductor substrate 101 and the supporting substrate 111 can be increased.

As described above, an SOI substrate according to one embodiment of the present invention can be manufactured in accordance with a variety of embodiments.

This embodiment can be freely combined with any of other embodiments.

Embodiment 3

In this embodiment, a method for manufacturing a thin film transistor using the SOI substrate manufactured in any of the above embodiments will be described.

First, with reference to FIGS. 7A to 7E and FIGS. 8A to 8C, a method for manufacturing an n-channel thin film transistor and a p-channel thin film transistor will be described. By combining a plurality of thin film transistors, various semiconductor devices can be formed. Note that descriptions of the same portions or portions having functions similar to those in Embodiments 1 and 2 are not repeated.

Figure 7A:
FIGS. 7A to 7E illustrate a method for manufacturing a semiconductor device according to Embodiment 3.

An SOI substrate 120 manufactured in accordance with Embodiment 1 is illustrated in FIG. 7A. In the SOI substrate 120 illustrated in FIG. 7A, the single crystal semiconductor layer 112 is formed over the supporting substrate 111 with the insulating film 102 interposed therebetween. Note that although an example in which the SOI substrate 120 having a structure illustrated in FIG. 2C is used will be shown here, an SOI substrate 120 having another structure described in this specification can also be used.

The single crystal semiconductor layer 112 is separated from the single crystal semiconductor substrate 101 and is subjected to a planarization treatment. The planarization treatment can be performed by combination of an etching treatment and laser irradiation.

Figure 7B:
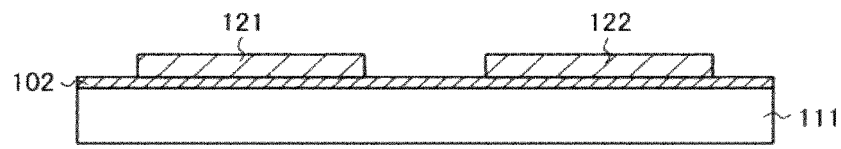

The single crystal semiconductor layer 112 is etched to form single crystal semiconductor layers 121 and 122 which are separated into island-like shapes corresponding to semiconductor elements (FIG. 7B). The single crystal semiconductor layer 121 forms an n-channel thin film transistor, and the single crystal semiconductor layer 122 forms a p-channel thin film transistor.

Before etching is performed on the single crystal semiconductor layer 112, it is preferable to add a p-type impurity element such as boron, aluminum, or gallium, or an n-type impurity element such as phosphorus or arsenic, to the single crystal semiconductor layer 112 in order to control the threshold voltage of the thin film transistors. For example, the p-type impurity element is added to a region where an n-channel thin film transistor is to be formed, and the n-type impurity element is added to a region where a p-channel thin film transistor is to be formed.

A gate insulating film 123 covering the single crystal semiconductor layers 121 and 122 is formed. Since the single crystal semiconductor layers 121 and 122 in this embodiment have high planarity, even if the gate insulating film 123 formed over the single crystal semiconductor layers 121 and 122 is thin, the gate insulating film 123 can cover the single crystal semiconductor layers 121 and 122 with favorable coverage. Therefore, defects in characteristics due to poor coverage of the gate insulating film can be prevented, so that a semiconductor device having high reliability can be manufactured with high yield. Thinning of the gate insulating film 123 has an effect of driving the thin film transistors at high speed with low voltage.

The gate insulating film 123 may be formed with a silicon oxide film or a stacked structure of a silicon oxide film and a silicon nitride film. The gate insulating film 123 may be formed by depositing an insulating film by a plasma CVD method or a low-pressure CVD method or may be formed by solid phase oxidation or solid phase nitridation by a plasma treatment. This is because the gate insulating film 123 formed by oxidation or nitridation of the single crystal semiconductor layers 121 and 122 by a plasma treatment is dense, has high withstand voltage, and is excellent in reliability.

As the gate insulating film 123, a high dielectric constant material such as zirconium dioxide, hafnium oxide, titanium dioxide, or tantalum pentoxide may be used. When a high dielectric constant material is used for the gate insulating film 123, gate leakage current can be reduced.

Figure 7C:
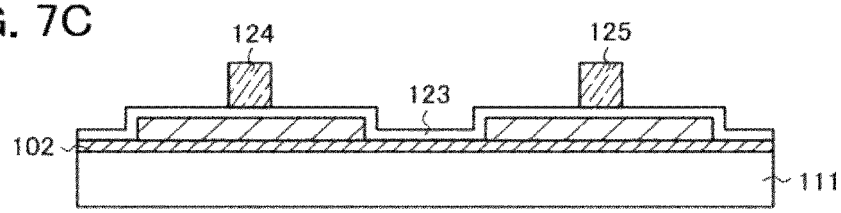
Figure 7D:
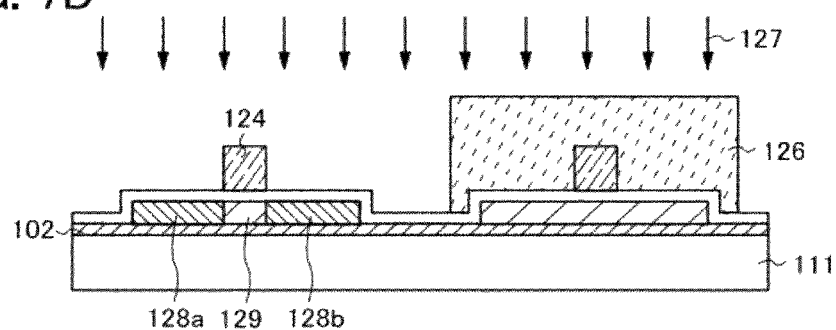

A conductive film is formed over the gate insulating film 123. The conductive film can be formed by a sputtering method, an evaporation method, a CVD method, or the like. The conductive film can be formed of an element selected from tantalum, tungsten, titanium, molybdenum, aluminum, copper, chromium, or neodymium; or an alloy material or a compound material containing any of the elements as its main component. Alternatively, a semiconductor layer typified by a polycrystalline silicon layer doped with an impurity element such as phosphorus, or an AgPdCu alloy may be used for the conductive film. Masks are formed over the conductive film, and the conductive film is selectively etched, whereby gate electrodes 124 and 125 can be formed (FIG. 7C).

A mask 126 covering the single crystal semiconductor layer 122 is formed. With the use of the mask 126 and the gate electrode 124 as masks, an impurity element 127 imparting n-type conductivity is added to form n-type impurity regions 128a and 128b (see FIG. 7D). In this embodiment, phosphine ($PH_3$) is used as a doping gas containing an impurity element. Here, the impurity element imparting n-type conductivity is added so as to be contained at concentrations of approximately $1 \times 10^{17}$ atoms/cm$^3$ to $5 \times 10^{18}$ atoms/cm$^3$ in the n-type impurity regions 128a and 128b. In this embodiment, phosphorus (P) is used as the impurity element imparting n-type conductivity. A region of the single crystal semiconductor layer 121 that overlaps with the gate electrode 124 serves as a channel formation region 129.

Figure 7E:
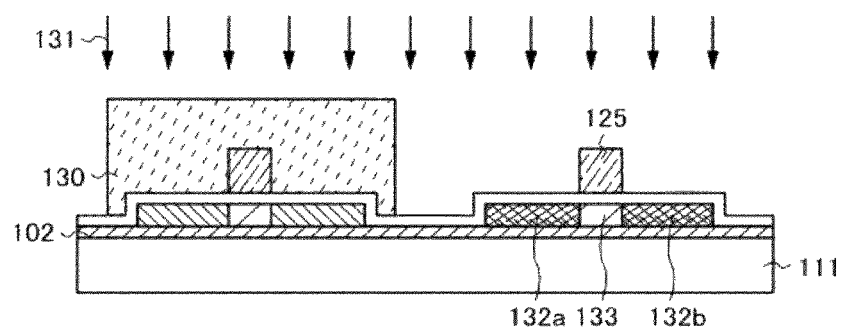

Next, after the mask 716 is removed, a mask 130 covering the single crystal semiconductor layer 121 is formed. With the use of the mask 130 and the gate electrode 125 as masks, an impurity element 131 imparting p-type conductivity is added to form p-type impurity regions 132a and 132b (FIG. 7E). In this embodiment, diborane ($B_2H_6$) is used as a doping gas containing an impurity element. In this embodiment, boron (B) is used as the impurity element imparting p-type conductivity. A region of the single crystal semiconductor layer 122 that overlaps with the gate electrode 125 serves as a channel formation region 133.

Figure 8A:
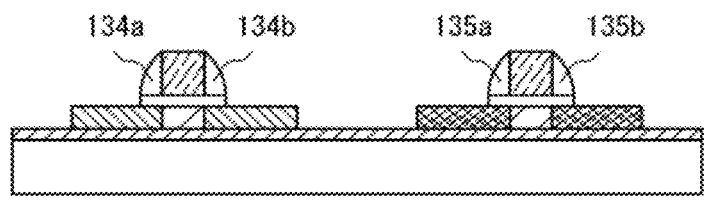
FIGS. 8A to 8C illustrate a method for manufacturing a semiconductor device according to Embodiment 3.

Next, after the mask 130 is removed, an insulating film having a single-layer structure or a stacked structure, which includes a nitrogen compound such as silicon nitride or an oxide such as silicon oxide, is formed by a plasma CVD method or the like. This insulating film is anisotropically etched in a perpendicular direction, whereby sidewall insulating films 134a and 134b which are in contact with the side surfaces of the gate electrode 124 and sidewall insulating films 135a and 135b which are in contact with the side surfaces of the gate electrode 125 are formed, as illustrated in FIG. 8A. By this anisotropic etching, the insulating film 123 is also etched.

Figure 8B:
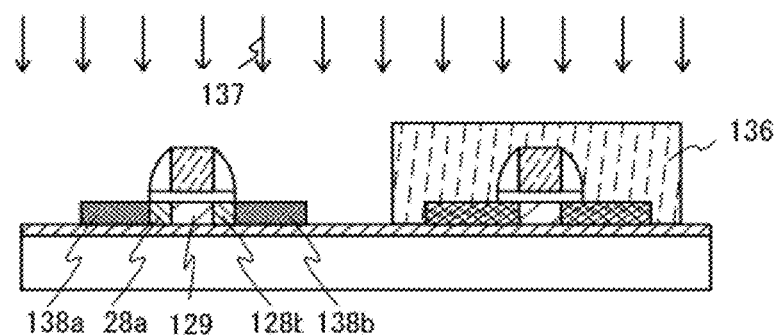

Next, the single crystal semiconductor layer 122 is covered with a mask 136, as illustrated in FIG. 8B. In order to form high-concentration impurity regions serving as a source region and a drain region in the single crystal semiconductor layer 121, a high dosage of an impurity element is added to the single crystal semiconductor layer 121 by an ion implantation method or an ion doping method. The gate electrode 124 and the sidewall insulating films 134a and 134b serve as masks, so that n-type high-concentration impurity regions 138a and 138b are formed. Next, after the mask 136 is removed, a heat treatment for activating the impurity element is performed.

Figure 8C:
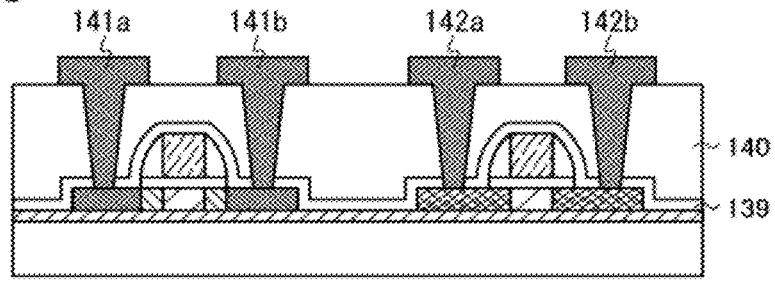

After the heat treatment for activation, as illustrated in FIG. 8C, an insulating film 139 containing hydrogen is formed. After the insulating film 139 is formed, hydrogen included in the insulating film 139 is dispersed in the single crystal semiconductor layers 121 and 122 by performing a heat treatment at a temperature of equal to or greater than 350° C. and equal to or less than 450° C. The insulating film 139 can be formed by deposition of a silicon nitride film or a silicon nitride oxide film by a plasma CVD method at a process temperature of equal to or less than 350° C. By supply of hydrogen to the single crystal semiconductor layers 121 and 122, defects to serve as trapping centers in the single crystal semiconductor layers 121 and 122 and at the interface with the insulating film 139 can be compensated effectively.

Next, an interlayer insulating film 140 is formed. The interlayer insulating film 140 can be formed of a film having a single-layer structure or a stacked structure of selected from an insulating film containing an inorganic material, such as a silicon oxide film or a BPSG (borophosphosilicate glass) film, and an organic resin film containing polyimide, acrylic, or the like. Next, contact holes are formed in the interlayer insulating film 140, and wirings 141a, 141b, 142a, and 142b are formed as illustrated in FIG. 8C. The wirings 141a, 141b, 142a, and 142b can be formed using a conductive film with a three-layer structure in which a low-resistance metal film such as an aluminum film or an aluminum alloy film is interposed between barrier metal films. The barrier metal films can be formed using metal films which include molybdenum, chromium, titanium, or the like.

By the foregoing steps, a semiconductor device having an n-channel thin film transistor and a p-channel thin film transistor can be manufactured. Since the metal element concentration of the single crystal semiconductor layer in which the channel formation region is formed is reduced in the manufacturing process of the SOI substrate, a thin film transistor in which off current is small and variation of the threshold voltage is suppressed can be manufactured.

Although the method for manufacturing a thin film transistor is described with reference to FIGS. 7A to 7E and 8A to 8C, a semiconductor device with high added value can be manufactured by forming a variety of semiconductor elements such as a capacitor and a resistor together with the thin film transistor.

The thin film transistor is not limited to this embodiment, and may have a single gate structure, in which one channel formation region is formed, a double gate structure, in which two channel formation region are formed, or a triple gate structure, in which three channel formation regions are formed.

In such a manner, thin film transistors can be manufactured using an SOI substrate according to one embodiment of the present invention. The single crystal semiconductor layer of the SOI substrate has almost no crystal defects and is a single crystal semiconductor layer with reduced interface state density with the gate insulating film 123. The semiconductor layer has a planarized surface and is thinned to a thickness of equal to or less than 50 nm. Accordingly, thin film transistors with excellent characteristics such as low driving voltage, high field effect mobility, and a low subthreshold value can be formed using the SOI substrate. Furthermore, plural transistors with high performance and less variation in characteristics between the thin film transistors can be formed over the same substrate. In other words, with the use of an SOI substrate according to one embodiment of the present invention, non-uniformity of the important characteristic value as transistor characteristics, such as threshold voltage or mobility, can be suppressed, and higher performance such as high field effect mobility is possible.

Therefore, a semiconductor device with high added value can be manufactured by forming various semiconductor elements such as thin film transistors using the SOI substrate according to one embodiment of the present invention.

Embodiment 4

Although the method for manufacturing a thin film transistor is described in Embodiment 3, a semiconductor device with high added value can be manufactured by forming a variety of semiconductor elements such as a capacitor and a resistor together with the thin film transistor. A specific embodiment of a semiconductor device will be described below with reference to the drawings.

Figure 9:
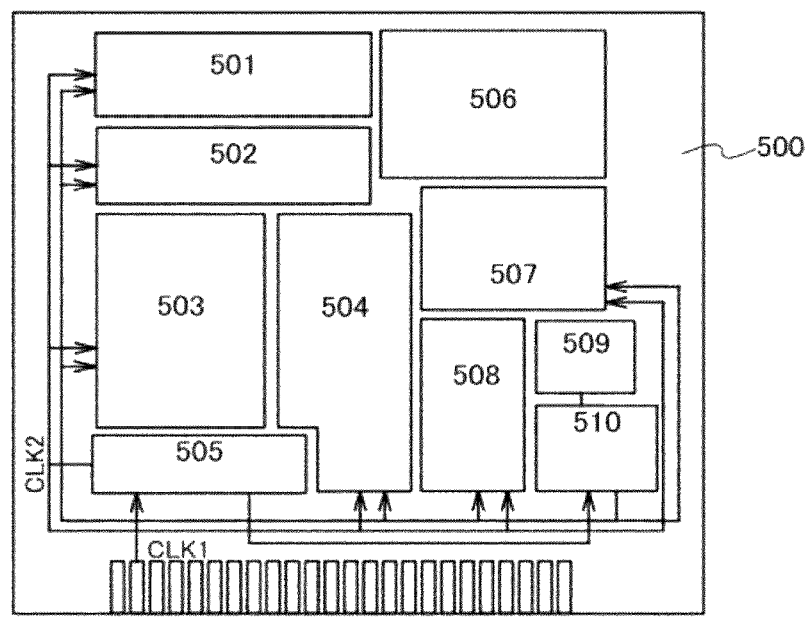
FIG. 9 is a block diagram illustrating a configuration of a microprocessor obtained using an SOI substrate.

First, as an example of a semiconductor device, a microprocessor is described. FIG. 9 is a block diagram illustrating a structural example of a microprocessor 500.

The microprocessor 500 includes an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read only memory 509, and a memory interface 510.

An instruction inputted to the microprocessor 500 through the bus interface 508 is inputted to the instruction decoder 503 and decoded. Then, the instruction is inputted to the ALU controller 502, the interrupt controller 504, the register controller 507, and the timing controller 505. The ALU controller 502, the interrupt controller 504, the register controller 507, and the timing controller 505 perform various controls based on the decoded instruction.

Specifically, the ALU controller 502 generates a signal for controlling the operation of the arithmetic logic unit 501. While the microprocessor 500 is executing a program, the interrupt controller 504 processes an interrupt request from an external input and output device or a peripheral circuit. The interrupt controller 504 judges the priority of the interrupt request or a mask state, and processes the interrupt request. The register controller 507 generates an address of the register 506, and reads/writes data from/to the register 506 in accordance with the state of the microprocessor 500. The timing controller 505 generates signals for controlling timing of operation of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As shown in FIG. 9, the internal clock signal CLK2 is inputted to another circuit.

Figure 10:
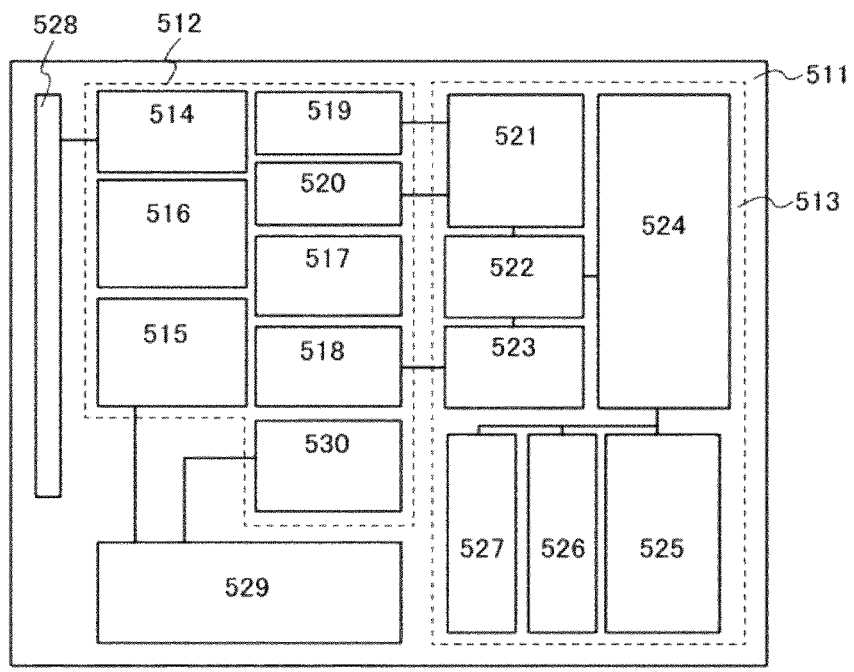
FIG. 10 is a block diagram illustrating a configuration of an RFCPU obtained using an SOI substrate.

Next, an example of a semiconductor device provided with a function for performing transmission/reception of data without contact and an arithmetic function is described. FIG. 10 is a block diagram illustrating a structural example of such a semiconductor device. The semiconductor device illustrated in FIG. 10 can be regarded as a computer (hereinafter also referred to as an "RFCPU") which operates to transmit and receive signals to and from an external device by wireless communication.

As illustrated in FIG. 10, an RFCPU 511 includes an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, and a modulation circuit 520. The digital circuit portion 513 includes an RF interface 521, a control register 522, a clock controller 523, a CPU interface 524, a central processing unit 525, a random access memory 526, and a read only memory 527.

The operation of the RFCPU 511 is roughly described below. The resonance circuit 514 generates induced electromotive force based on a signal received at an antenna 528. The induced electromotive force is stored in a capacitor portion 529 via the rectifier circuit 515. The capacitor portion 529 is preferably formed using a capacitor such as a ceramic capacitor or an electric double layer capacitor. The capacitor portion 529 is not necessarily integrated on the same substrate as the RFCPU 511 and may be incorporated into the RFCPU 511 as a component.

The reset circuit 517 generates a signal that resets the digital circuit portion 513 to be initialized. For example, as a reset signal, the reset circuit generates a signal which rises after rise in the supply voltage with delay. The oscillator circuit 518 changes the frequency and the duty ratio of a clock signal in accordance with a control signal generated by the constant voltage circuit 516. The demodulation circuit 519 demodulates a received signal, and the modulation circuit 520 modulates data to be transmitted.

For example, the demodulation circuit 519 is formed using a low-pass filter and binarizes a received signal of an amplitude shift keying (ASK) system based on variation of the amplitude. The modulation circuit 520 transmits transmission data by changing the amplitude of a transmission signal of the amplitude shift keying (ASK) system. Therefore, the modulation circuit 520 changes the resonance point of the resonance circuit 514, whereby the amplitude of a communication signal is changed.

The clock controller 523 generates a control signal for changing the frequency and the duty ratio of the clock signal in accordance with the power supply voltage or current consumption in the central processing unit 525. The power supply voltage is monitored by a power-supply control circuit 530.

A signal that is inputted to the RFCPU 511 from the antenna 528 is demodulated by the demodulation circuit 519 and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like.

The central processing unit 525 accesses the read only memory 527, the random access memory 526, and the control register 522 via the CPU interface 524. The CPU interface 524 has a function of generating an access signal for any one of the read only memory 527, the random access memory 526, or the control register 522 based on an address requested by the central processing unit 525.

As an arithmetic method of the central processing unit 525, a method may be employed in which the read only memory 527 stores an OS (operating system) and a program is read at the time of starting operation and then executed. Alternatively, a method in which a circuit dedicated to arithmetic is formed and an arithmetic process is conducted using hardware can be employed. In a method in which both hardware and software are used, part of arithmetic processing can be conducted by a circuit dedicated to arithmetic, and the other part of the arithmetic processing can be conducted by the central processing unit 525 using a program.

In such an RFCPU, an integrated circuit is formed using the single crystal semiconductor layer 112 with reduced crystal defects and a uniform crystal orientation; therefore, processing speed is increased and power consumption can be reduced. Accordingly, even when the capacitor portion 529 which supplies power is miniaturized, long-term operation is ensured.

Embodiment 5

In this embodiment, display devices using an SOI substrate according to one embodiment of the present invention will be described with reference to FIGS. 11A and 11B and FIGS. 12A and 12B.

Figure 11A:
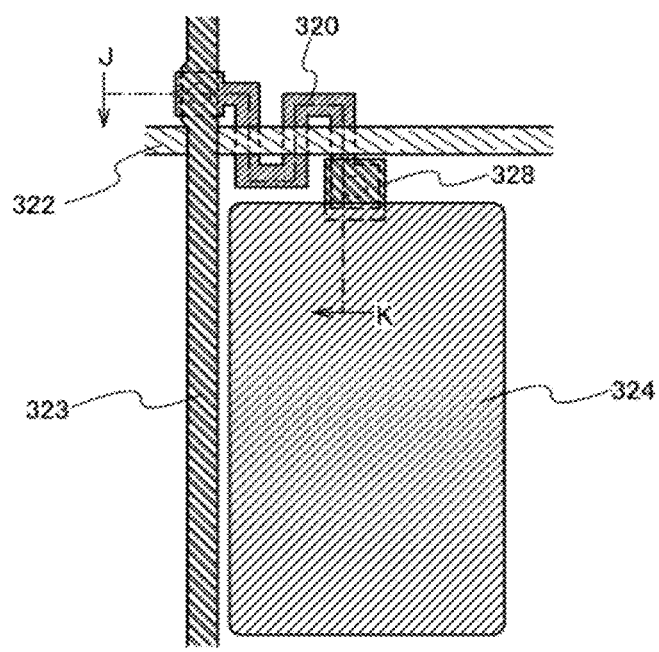
FIG. 11A is a plan view of a pixel of a liquid crystal display device.
Figure 11B:
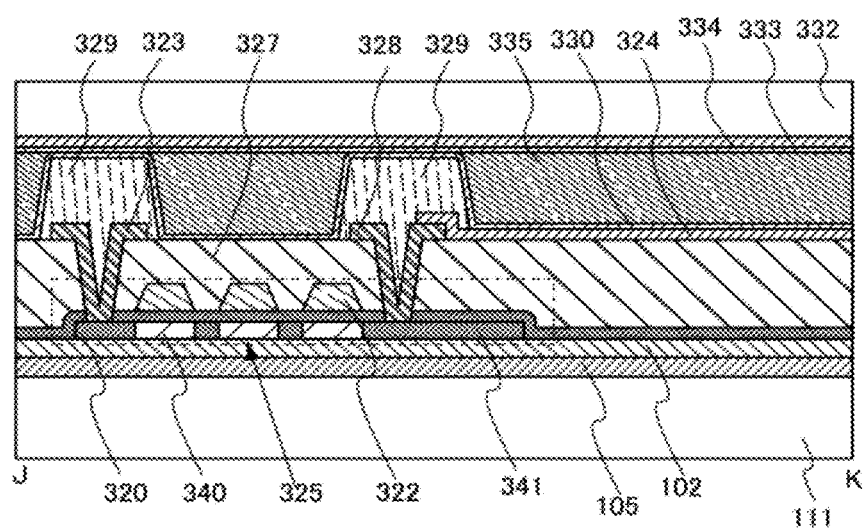
FIG. 11B is a cross-sectional view taken along line J-K in FIG. 11A.

FIGS. 11A and 11B are the drawings for describing a liquid crystal display device. FIG. 11A is a plan view of a pixel of a liquid crystal display device, and FIG. 11B is a cross-sectional view taken along section line J-K in FIG. 11A.

As illustrated in FIG. 11A, the pixel includes a single crystal semiconductor layer 320, a scan line 322 intersecting with the single crystal semiconductor layer 320, a signal line 323 intersecting with the scan line 322, a pixel electrode 324, and an electrode 328 which electrically connects the pixel electrode 324 and the single crystal semiconductor layer 320. The single crystal semiconductor layer 320 is a layer formed using a single crystal semiconductor layer of an SOI substrate according to one embodiment of the present invention, in which planarization and reduction of crystal defects are achieved by a first etching treatment, a second etching treatment, and then laser irradiation. The single crystal semiconductor layer 320 is included in a thin film transistor 325 of the pixel.

As an SOI substrate, any of the SOI substrates described in Embodiment 1 and Embodiment 2 above is used. As illustrated in FIG. 11B, the single crystal semiconductor layer 320 is provided over the supporting substrate 111 with the insulating film 105 and the insulating film 102 interposed therebetween. As the supporting substrate 111, a glass substrate can be used. The single crystal semiconductor layer 320 of the thin film transistor 325 is formed by etching the single crystal semiconductor layer of the SOI substrate for element isolation. Channel formation regions 340 and n-type high-concentration impurity regions 341 to which an impurity element is added are formed in the single crystal semiconductor layer 320. A gate electrode of the thin film transistor 325 is included in the scan line 322 and one of a source electrode and a drain electrode of the thin film transistor 325 is included in the signal line 323.

The signal line 323, the pixel electrode 324, and the electrode 328 are provided over an interlayer insulating film 327. Columnar spacers 329 are formed over the interlayer insulating film 327. An orientation film 330 is formed to cover the signal line 323, the pixel electrode 324, the electrode 328, and the columnar spacers 329. A counter substrate 332 is provided with a counter electrode 333 and an orientation film 334 covering the counter electrode 333. The columnar spacers 329 are formed in order to maintain space between the supporting substrate 111 and the counter substrate 332. A liquid crystal layer 335 is formed in the space formed by the column spacers 329. The interlayer insulating film 327 has steps at the connection portions between the high-concentration impurity region 341 and the signal line 323, and the high-concentration impurity region 341 and the electrode 328 due to formation of contact holes; therefore, orientation of liquid crystals in the liquid crystal layer 335 tends to be disordered at these connection portions. Therefore, the columnar spacers 329 are formed at these step portions to prevent disorder of liquid crystal orientation.

An SOI substrate which is manufactured by a method for manufacturing an SOI substrate according to one embodiment of the present invention has high crystallinity; therefore, high performance transistors with little variation in characteristics between the transistors can be formed over the same substrate. Thus, by manufacturing a liquid crystal display device using the SOI substrate according to one embodiment of the present invention, variation of characteristics between transistors can be made small.

Figure 12A:
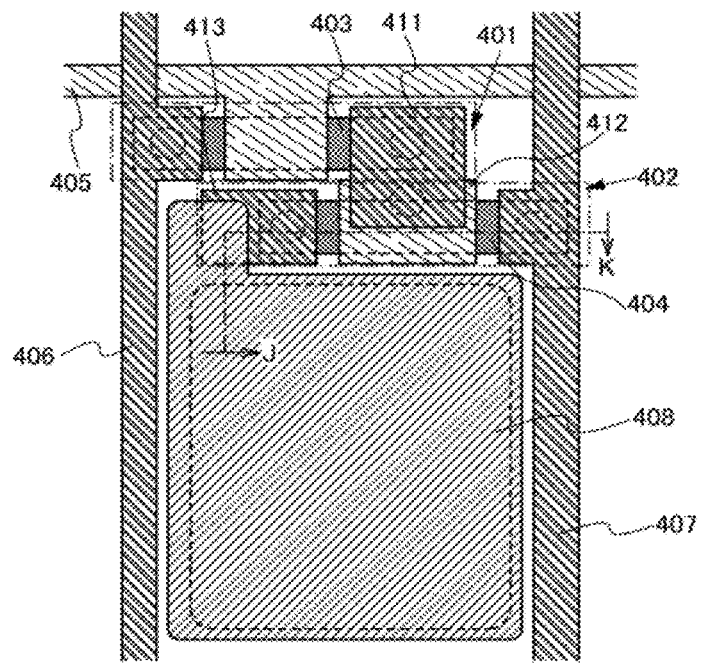
FIG. 12A is a plan view of a pixel of an electroluminescence display device.
Figure 12B:
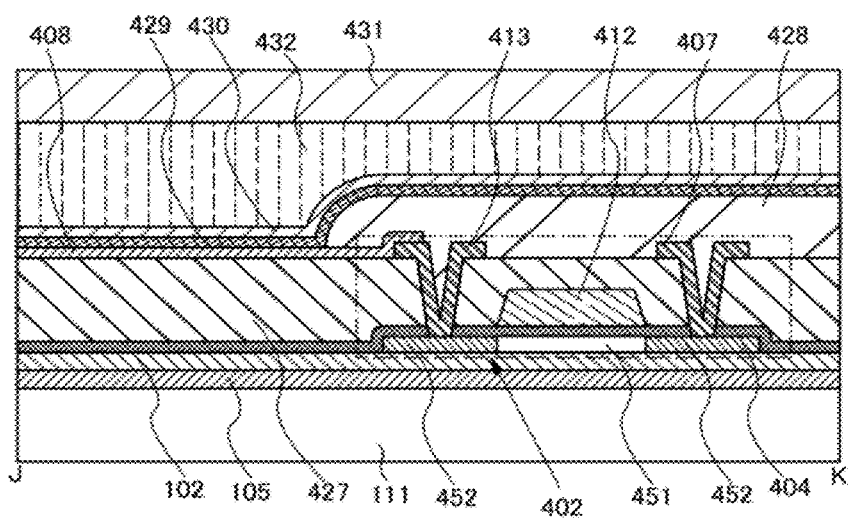
FIG. 12B is a cross-sectional view taken along line J-K in FIG. 12A.

Next, an electroluminescent display device (hereinafter referred to as an EL display device) is described with reference to FIGS. 12A and 12B. FIG. 12A is a plan view of a pixel of an EL display device, and FIG. 12B is a cross-sectional view taken along section line J-K in FIG. 12A.

As illustrated in FIG. 12A, the pixel includes a selection transistor 401 and a display control transistor 402, which are transistors, a scan line 405, a signal line 406, a current supply line 407, and a pixel electrode 408. In the EL display device, each pixel is provided with a light-emitting element having a structure in which a layer including an electroluminescent material (hereinafter this layer is referred to as an "EL layer") is sandwiched between a pair of electrodes. One electrode of the light emitting element is the pixel electrode 408. Further, in a semiconductor film 403, a channel formation region, a source region, and a drain region of the selection transistor 401 are formed. Further, in a semiconductor film 404, a channel formation region, a source region, and a drain region of the display control transistor 402 are formed. The semiconductor films 403 and 404 are layers formed using a single crystal semiconductor layer 302 provided over the supporting substrate.

In the selection transistor 401, a gate electrode is included in the scan line 405, one of a source electrode and a drain electrode is included in the signal line 406, and the other thereof is formed as an electrode 410. In the display control transistor 402, a gate electrode 412 is electrically connected to an electrode 411, one of a source electrode and a drain electrode is formed as an electrode 413 which is electrically connected to the pixel electrode 408, and the other thereof is included in the current supply line 407.

The display control transistor 402 is a p-channel thin film transistor. As illustrated in FIG. 12B, a channel formation region 451 and a p-type high-concentration impurity region 452 are formed in the semiconductor film 404. Note that as an SOI substrate, any of the SOI substrate manufactured in Embodiments 1 and 2 is used.

An interlayer insulating film 427 is formed to cover the gate electrode 412 of the display control transistor 402. Over the interlayer insulating film 427, the signal line 406, the current supply line 407, the electrode 411, the electrode 413, and the like are formed. Over the interlayer insulating film 427, the pixel electrode 408 which is electrically connected to the electrode 413 is formed. A peripheral portion of the pixel electrode 408 is surrounded by a partition wall layer 428 having an insulating property. An EL layer 429 is formed over the pixel electrode 408, and a counter electrode 430 is formed over the EL layer 429. A counter substrate 431 is provided as a reinforcing plate, and the counter substrate 431 is fixed to the supporting substrate 111 with a resin layer 432.

The gray scale of the EL display device can be controlled by a current driving method in which luminance of a light-emitting element is controlled by current or a voltage driving method in which luminance of a light-emitting element is controlled by voltage. The current driving method is difficult to be employed when transistors have characteristic values which are largely different in each pixel, it is difficult to employ the current driving method, and thus compensation circuit for compensating variation in characteristics is necessary. However, since an SOI substrate which is manufactured by a method for manufacturing an SOI substrate according to one embodiment of the present invention has almost no crystal defect, a plurality of high-performance transistors with little variation in characteristics can be formed over the same substrate. Thus, by manufacturing an EL display device using an SOI substrate according to one embodiment of the present invention, the selection transistor 401 and the display control transistor 402 do not have variation in characteristics in each pixel; therefore, the current driving method can be employed.

Embodiment 6

A semiconductor device such as a transistor can be manufactured using an SOI substrate according to one embodiment of the present invention, and a variety of electronic devices can be completed using the semiconductor device. Since a single crystal semiconductor layer provided in an SOI substrate according to one embodiment of the present invention has reduced crystal defects, by using such a single crystal semiconductor layer as an active layer, a semiconductor element with improved electric characteristics can be manufactured. In addition, since the single crystal semiconductor layer has reduced crystal defects, interface state density at an interface with a gate insulating layer can be reduced. Further, since the single crystal semiconductor layer has high planarity, a gate insulating layer which is thin and has a high withstand voltage can be formed over the single crystal semiconductor layer; therefore, improvement in mobility, improvement in an S value, or suppression of a short channel effect of a manufactured semiconductor element can be achieved. In other words, with the use of an SOI substrate according to one embodiment of the present invention, a semiconductor element which is highly reliable and has high current drive capability can be manufactured. As a result, electronic devices which are end products can be manufactured with high throughput and high quality. Various kinds of semiconductor devices can be manufactured using the semiconductor element. In this embodiment, specific examples will be described with reference to the drawings. Note that in this embodiment, portions similar to those in the above embodiments are denoted by the same reference numerals, and detailed descriptions thereof are omitted.

Figure 13A:
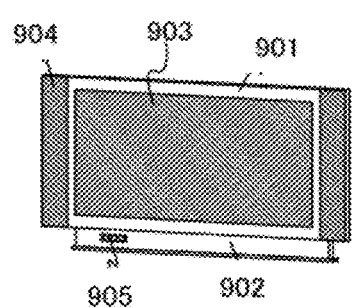
FIGS. 13A to 13F are views each illustrating an electronic device to which one embodiment of the present invention is applied.

FIG. 13A illustrates a display device, which includes a chassis 901, a supporting base 902, a display portion 903, a speaker portion 904, a video input terminal 905, and the like. This display device is manufactured using the transistors formed by the manufacturing method described in any of other embodiments for a driver IC, the display portion 903, and the like. The display device includes a liquid crystal display device, a light-emitting display device, and the like, and moreover includes all display devices for displaying information, such as for a computer, television reception, advertisement display, and the like. Specifically, a display, a head mount display, a reflection type projector, and the like are given.

Figure 13B:
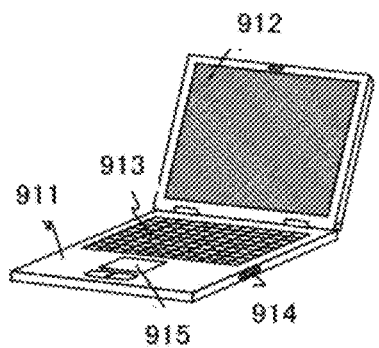

FIG. 13B illustrates a computer, which includes a chassis 911, a display portion 912, a keyboard 913, an external connection port 914, a pointing device 915, and the like. A transistor manufactured according to one embodiment of the present invention can be applied not only to a pixel portion in the display portion 912 but also to a semiconductor device such as a driver IC for display, a CPU inside a main body, or a memory.

Figure 13C:
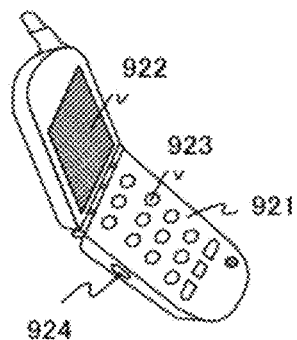

FIG. 13C illustrates a cellular phone, which is a typical example of a portable information processing terminals. This cellular phone includes a chassis 921, a display portion 922, operation keys 923, and the like. A transistor manufactured according to one embodiment of the present invention can be applied not only to a pixel portion in the display portion 922 or a sensor portion 924 but also to a driver IC for display, a memory, an audio processing circuit, or the like. The sensor portion 924 includes an optical sensor element, by which the luminance of the display portion 922 is controlled based on the illuminance obtained by the sensor portion 924, and the brightness of the operation keys 923 is controlled based on the illuminance obtained by the sensor portion 924. Thus, the power consumption of the cellular phone can be suppressed.

The semiconductor device manufactured according to one embodiment of the present invention can be used for an electronic device such as personal digital assistants (PDA), a digital camera, a small game machine, or a mobile audio reproducing device, in addition to the above cellular phone. For example, it is possible to apply the semiconductor device according to one embodiment of the present invention to a functional circuit such as a CPU, a memory, or a sensor or to a pixel portion of such an electronic device or a driver IC for display.

Figure 13D:
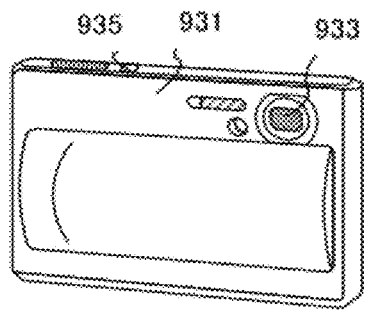
Figure 13E:
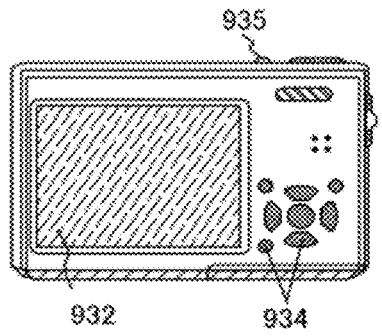

FIGS. 13D and 13E illustrate a digital camera. Note that FIG. 13E illustrates a rear side of the digital camera illustrated in FIG. 13D. This digital camera includes a chassis 931, a display portion 932, a lens 933, operation keys 934, a shutter button 935, and the like. A transistor manufactured according to one embodiment of the present invention can be applied to a pixel portion of the display portion 932, a driver IC for driving the display portion 932, a memory, and the like.

Figure 13F:
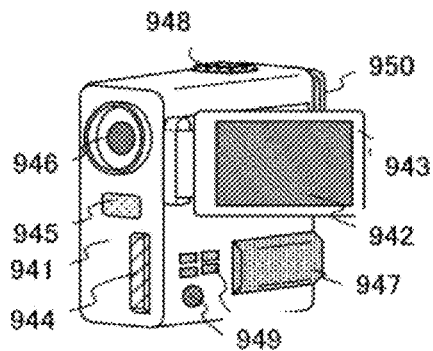

FIG. 13F illustrates a digital video camera. This digital video camera includes a main body 941, a display portion 942, a chassis 943, an external connection port 944, a remote control receiving portion 945, an image receiving portion 946, a battery 947, an audio input portion 948, operation keys 949, an eye piece portion 950, and the like. A transistor manufactured according to one embodiment of the present invention can be applied to a pixel portion of the display portion 942, a driver IC for controlling the display portion 942, a memory, a digital input processing device, and the like.

Besides, the semiconductor device according to one embodiment of the present invention can be applied to a navigation system, an audio reproducing device, an image reproducing device provided with a recording medium, and the like. Transistors manufactured according to one embodiment of the present invention can be applied to pixel portions of display portions of these devices, driver ICs for controlling the display portions, memories, digital input processing devices, sensor portions, and the like.

Figure 14A:
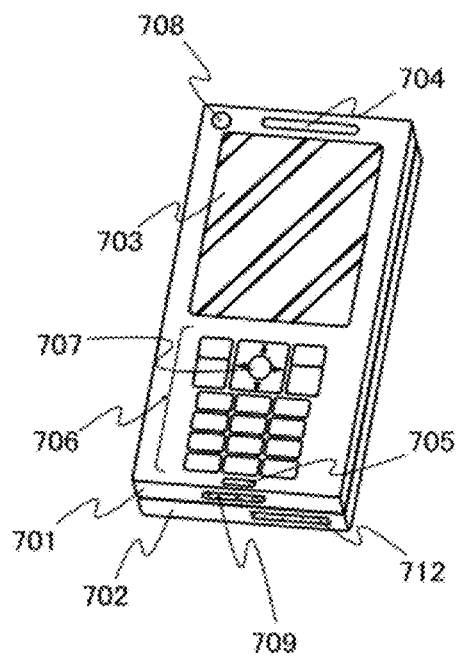
FIGS. 14A to 14C illustrate a cellular phone to which one embodiment of the present invention is applied.
Figure 14B:
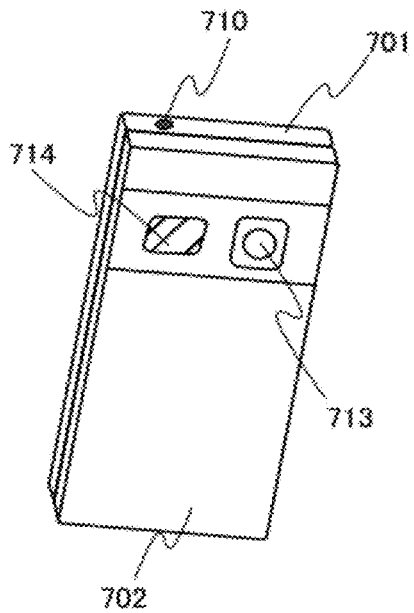
Figure 14C:
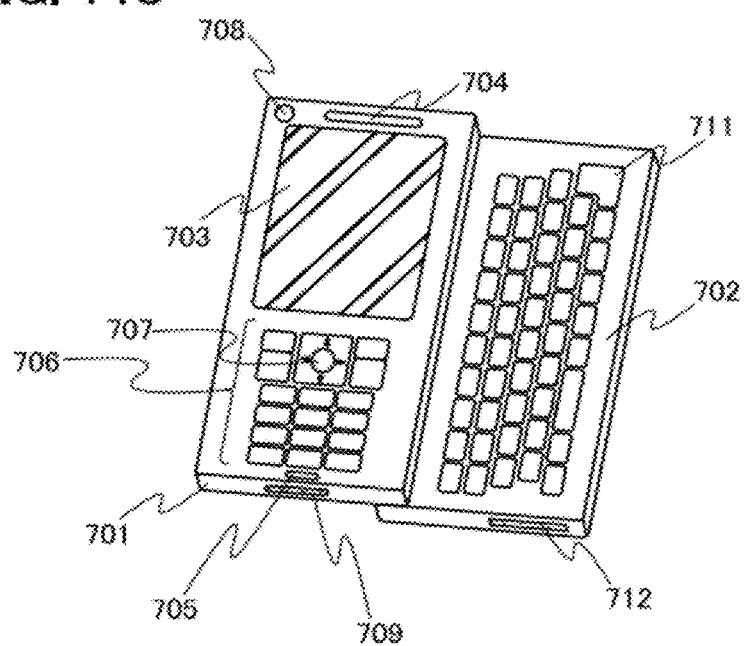

FIGS. 14A to 14C illustrate another example of a cellular phone to which one embodiment of the present invention is applied. FIG. 14A is a front view, FIG. 14B is a rear view, and FIG. 14C is a front view in which two chassis are slid. A cellular phone 700 has both of functions of a cellular phone and a portable information terminal, and incorporates a computer; thus, the cellular phone is a so-called smartphone which is capable of a variety of data processing in addition to voice calls.

The cellular phone 700 has chassis 701 and 702. The chassis 701 includes a display portion 703, a speaker 704, a microphone 705, operation keys 706, a pointing device 707, a camera lens 708, an external connection terminal 709, an earphone terminal 710, and the like. The chassis 702 includes a keyboard 711, an external memory slot 712, a rear camera 713, a light 714, and the like. In addition, an antenna is incorporated in the chassis 701. A semiconductor element manufactured according to one embodiment of the present invention can be applied to a pixel portion of the display portion 703, a driver IC for driving the display portion 703, a memory, an audio processing circuit, and the like. Further, by applying the liquid crystal display device illustrated in FIGS. 11A and 11B or the EL display device illustrated in FIGS. 12A and 12B to the display portion 703, the display portion can have little display unevenness and excellent image quality.

Further, in addition to the above structure, the cellular phone 700 may incorporate a non-contact IC chip, a small memory device, or the like.

The chassis 701 and 702 which overlap with each other (illustrated in FIG. 14A) can be slid, and are slid to be developed as illustrated in FIG. 14C. Since the display portion 703 and the camera lens 708 are provided in the same plane, the smartphone can be used as a videophone. Further, a still image and a moving image can be taken with the rear camera 713 and the light 714, using the display portion 703 as a viewfinder.

With the use of the speaker 704 and the microphone 705, the cellular phone 700 can be used as an audio recording device (recording device) or an audio playing device. With the use of the operation keys 706, further, operations of incoming and outgoing of calls, simple information input such as electronic mail, scrolling of a screen, cursor movement, e.g., for selecting information to be displayed in the display portion, and the like are possible.

If much information needs to be treated in documentation, use as a portable information terminal, and the like, it is convenient to use the keyboard 711. Further, the chassis 701 and the chassis 702 which overlap with each other (FIG. 14A) can be slid to be developed as illustrated in FIG. 14C. In using the cellular phone 700 as a portable information terminal, a cursor can be moved smoothly with the use of the keyboard 711 and the pointing device 707. To the external connection terminal 709, an AC adaptor and various types of cables such as a USB cable can be connected, and charging and data communication with a personal computer or the like are possible. Further, by inserting a recording medium in the external memory slot 712, a larger amount of data can be stored and transferred.

In the rear surface of the chassis 702 (FIG. 14B), the rear camera 713 and the light 714 are provided, and a still image and a moving image can be taken using the display portion 703 as a viewfinder.

Further, the cellular phone 700 may have an infrared communication function, a USB port, a function of receiving one segment television broadcast, a non-contact IC chip, an earphone jack, or the like, in addition to the above functions and structures.

As described above, the applicable range of a semiconductor device manufactured according to one embodiment of the present invention is so wide that the semiconductor device can be applied to electronic devices in a variety of fields with the use of an SOI substrate according to one embodiment of the present invention.

Example 1

One embodiment of the present invention will be described below in more detail based on Example 1. Described in this example below is an experimental result of plasma effect on a single crystal semiconductor layer, which is caused by forming the single crystal semiconductor layer and then performing a plasma treatment. In order to examine the plasma effect, the lifetime of carriers which are included in the single crystal semiconductor layer was measured.

Here, the "lifetime" means an average lifetime from generation of carriers in a semiconductor to recombination of the carriers to decay. For example, a semiconductor wafer (silicon wafer) is irradiated with light, which leads to generation of electrons and holes (carriers) in the semiconductor wafer. The generated electrons and holes are recombined to decay. In this manner, the average lifetime from generation of carriers to recombination and decay of the carriers is called the "lifetime." Note that the "lifetime" is also called a "recombination lifetime" or a "carrier lifetime".

Excess carriers of electrons and holes being introduced into a semiconductor wafer by light irradiation or the like are recombined through traps when a trap level due to a lattice defect, a heavy-metal impurity, or the like exists in the semiconductor wafer, which decrease the lifetime. That is, improvement in lifetime leads to improvement in carrier mobility, which can bring improvement in electric characteristics (high-speed operation and the like) of a completed transistor.

Figure 15:
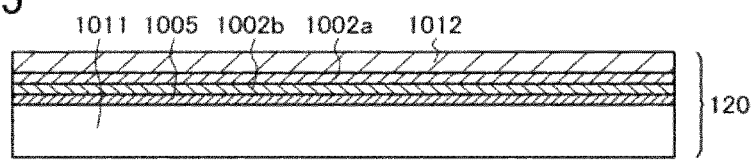
FIG. 15 illustrates a view illustrating a structure of an SOI substrate according to Example 1.

The structure of an SOI substrate which is a sample used in this example is described. FIG. 15 is a cross-sectional view illustrating a structure of an SOI substrate whose characteristics were evaluated in this example. The SOI substrate illustrated in FIG. 15 is manufactured through the steps of FIGS. 1A to 1E in Embodiment 1 and has a structure in which a single crystal silicon layer is bonded to a glass substrate with an insulating film interposed therebetween. Note that in this embodiment, a glass substrate is used as a supporting substrate, and a single crystal silicon substrate is used as a single crystal semiconductor substrate. A method for manufacturing the SOI substrate is briefly described below.

First, a single crystal silicon substrate 1001 for forming a single crystal silicon layer 1012 was prepared. An oxidation treatment was performed on one surface of the single crystal silicon substrate to form an oxide film with a thickness of 100 nm on the surface of the single crystal silicon substrate. The oxidation treatment was performed by adding a gas containing a chlorine element in an oxidation atmosphere.

Next, the single crystal silicon substrate was irradiated with ions with an ion doping apparatus, so that an embrittlement region was formed in the single crystal silicon substrate. At the time of forming the embrittlement region, a 100% hydrogen gas was used as a source gas, and the single crystal silicon substrate was irradiated with ions in plasma that was generated by excitation of the hydrogen gas and accelerated by a voltage without any mass separation. The irradiation with ions was performed from the surface of the single crystal silicon substrate on which a silicon oxynitride layer 1002a and a silicon nitride oxide layer 1002b were formed. The doping conditions at this time were set as follows: a power output was 100 W; an accelerating voltage was 40 kV; and a dose was $2.2 \times 10^{16}$ ions/cm$^2$.

By excitation of a hydrogen gas in the ion doping apparatus, three kinds of ion species, $H^+$ ions, $H_2^+$ ions, and $H_3^+$ ions, are produced. In this example, the all kinds of ion species generated by excitation of the hydrogen gas were accelerated by a voltage, and the single crystal silicon substrate was irradiated with the ion species. At this moment, the proportion of $H_3^+$ ions in the ion species that were generated from the hydrogen gas was about 80%. The depth in a thickness direction of the embrittlement region was controlled so that the separated single crystal silicon layer 1012 had a thickness of equal to or greater than 100 nm and equal to or less than 120 nm.

After a glass substrate 1011 and the single crystal silicon substrate 1001 provided with an insulating layer were subjected to ultrasonic cleaning in pure water and were then cleaned with ozone-containing pure water, the glass substrate and the single crystal silicon substrate were attached to each other with the insulating layer interposed therebetween. In other words, as bonding planes, one surface of the glass substrate 1011 and one surface of a silicon oxide layer 1005 on the side of the single crystal silicon substrate 1001, on which the embrittlement region is formed, were disposed in contact so as to be bonded to each other.

Substrates in which the glass substrate and the single crystal silicon substrate were attached to each other were subjected to a heat treatment at 600° C. in a vertical-resistance heating furnace, whereby the single crystal silicon layer 1012 was separated in the embrittlement region which was formed in the single crystal silicon substrate. The glass substrate 1011 to which the single crystal silicon layer 1012 was attached with the insulating layer interposed therebetween was obtained.

Next, a surface of the single crystal silicon layer 1012 was subjected to a first dry etching treatment to remove the surface of the single crystal silicon layer by about 5 nm to 15 nm. The conditions of the first dry etching were as follows: a flow rate of chlorine which is an etching gas was 100 sccm; a power supplied to a coil-shaped electrode was 150 W; a power supplied to a lower electrode (a bias side) was 40 W; a reaction pressure was 1.0 Pa; and a temperature of the lower electrode was 70° C.

Next, the single crystal silicon layer which has been subjected to the dry etching was irradiated with laser light. The irradiation conditions of laser light were as follows: a pulse width was 25 nsec; and a repetition rate was 30 Hz, with the use of a XeCl excimer laser which emits a beam having a wavelength of 308 nm.

Next, the single crystal silicon layer 1012 which has been irradiated with the laser light was subjected to a second dry etching treatment to remove the single crystal silicon layer by about 40 nm to 45 nm so that the thickness of the single crystal silicon layer was 55 nm to 65 nm. The conditions of the second dry etching were as follows: a flow rate of chlorine which is an etching gas was 100 sccm; a power supplied to a coil-shaped electrode was 150 W; a power supplied to the lower electrode was 40 W; a reaction pressure was 1.0 Pa; and a temperature of the lower electrode was 40° C. The single crystal silicon layer which was obtained through the foregoing steps was used as a Sample A.

Next, a single crystal silicon layer which was formed by a method similar to the method for manufacturing the Sample A, on which a heat treatment was performed, was prepared. The heat treatment was performed at 600° C. for 4 hours. The single crystal silicon layer which was obtained through the foregoing steps was used as a Sample B.

Next, a single crystal silicon layer which was formed by a method similar to the method for manufacturing Sample A, on which a plasma treatment was performed using water vapor, was prepared. The conditions of the plasma treatment were as follows: a flow rate of $H_2O$ was 300 sccm; a power supplied to a coil-shaped electrode was 1800 W; a reaction pressure was 66.5 Pa; a temperature of a lower electrode was 250° C.; and the plasma treatment was performed for 180 seconds. The single crystal silicon layer which was obtained through the foregoing steps was used as a Sample C.

The lifetimes of carriers included in the single crystal silicon layers of the Samples A to C were measured by a microwave photoconductivity decay method (μ-PCD method). The μ-PCD method is a measurement method of evaluating a lifetime without contact: each single crystal silicon layer is irradiated with microwaves and pulsed laser light, so that the lifetime from generation of excessive carriers in the single crystal silicon layer to recombination and decay of the carriers is measured. Generation of the carriers increases the conductivity of the single crystal silicon layer, and thus the reflectance of microwaves with which the single crystal silicon layer is irradiated changes in accordance with the excessive carrier density. The time of decrease in the reflectance of the microwaves is measured, whereby the lifetime of the carriers can be measured.

In this example, with the use of a crystallinity evaluation apparatus using microwaves (produced by KOBELCO RESEARCH INSTITUTE, INC.), the Samples A to C were each irradiated with microwaves with a frequency of 13.56 MHz and with third harmonics of a YLG laser with a wavelength of 349 nm, and change in reflection intensity with time, which changes in accordance with generation of carriers, was measured with a voltmeter for measuring a phase contrast of microwaves. The measurement was performed after each of the following steps: separation of the single crystal silicon layer; the first dry etching; the laser irradiation; the second dry etching; and the heat treatment or the plasma treatment. Note that the peak of the measured values is steep and thus the time of decay caused by carrier recombination cannot be measured. However, as a peak level of the reflection intensity gets higher, a lifetime of carriers gets relatively longer, which indicates higher crystallinity. Thus, the lifetimes of carriers of the samples were compared with each other using the peak levels of the reflection intensity. Note that the peak levels of the reflection intensity which were compared in this example are standardized. Since the peak level of the reflection intensity is in proportion to the thickness of the single crystal silicon layer, information on crystallinity can be extracted by compensating the peak level with the thickness. Thus, the standardized peak level can be obtained by dividing the peak level of the reflection intensity by the thickness (nm) of the single crystal silicon layer.

Figure 16:
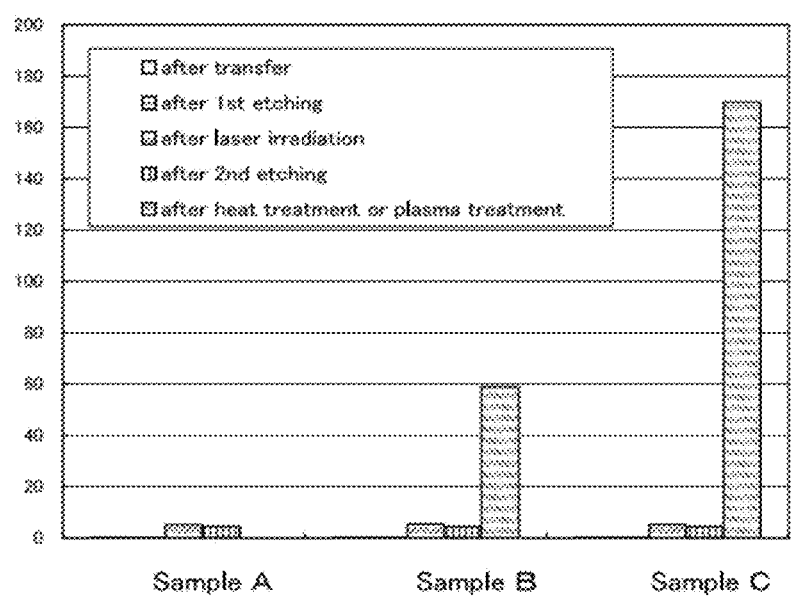
FIG. 16 is a graph showing a measurement result of a lifetime evaluation of a single crystal silicon layer.

Table 1 and FIG. 16 show lifetime measurement results of the Samples A to C. In FIG. 16, the horizontal axis indicates the Samples A to C and the vertical axis indicates the peak level of the reflection intensity. As the peak level of the reflection intensity gets higher, the lifetime gets longer.

TABLE 1

| | Sample A | | Sample B | | Sample C | |
|---|---|---|---|---|---|---|
| | standardized peak level | thickness (nm) | standardized peak level | thickness (nm) | standardized peak level | thickness (nm) |
| after transfer | 0.265 | 122 | 0.291 | 123 | 0.273 | 122 |
| after first etching | 0.225 | 108 | 0.249 | 108 | 0.228 | 107 |
| after laser irradiation | 5.14 | 108 | 5.39 | 108 | 5.27 | 107 |
| after second etching | 4.45 | 62.2 | 4.36 | 63.8 | 4.31 | 61.2 |
| after heat treatment or plasma treatment | — | 62.2 | 58.9 | 63.8 | 170 | 61.2 |

It was found from Table 1 and FIG. 16 that the peak level of the reflection intensity was higher in the order of the Sample C, the Sample B, and the Sample A. That is, it was found that the single crystal silicon layer subjected to the plasma treatment using water vapor after the second dry etching had the longest lifetime. Therefore, it was found that it was possible to increase the lifetime of the single crystal silicon layer significantly by performing the plasma treatment using water vapor after the second dry etching.

From the foregoing results, it was confirmed that, even when a supporting substrate having low heat resistance is used, it was possible to reduce crystal defects sufficiently by applying one embodiment of the present invention. In addition, it was confirmed that it was possible to manufacture an SOI substrate having excellent crystallinity with high yield.

Example 2

In this example, characteristics of a thin film transistor is manufactured using a single crystal silicon layer subjected to a plasma treatment after a second etching treatment will be described using results shown in FIGS. 18A and 18B. A thin film transistor which is used in this example will be described below.

Figure 17:
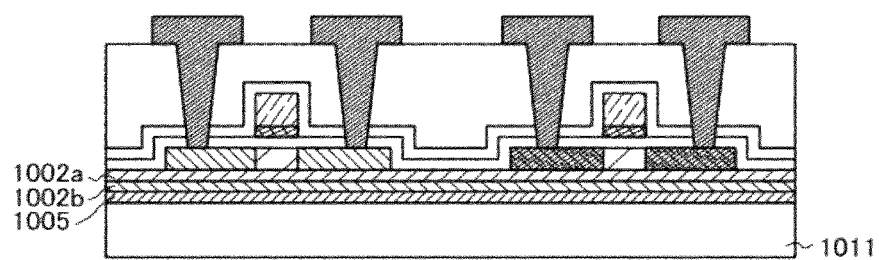
FIG. 17 is a view illustrating a structure of a semiconductor device according to Example 2.

FIG. 17 illustrates a structure of the thin film transistor manufactured in this example. The thin film transistor of this example has a single-gate structure. A silicon oxide film (100 nm thickness) which is formed by an oxidation treatment is formed over a glass substrate. In addition, a gate insulating layer (a stack of a silicon oxide layer having a thickness of 10 nm and a silicon oxynitride layer having a thickness of 10 nm) is formed over a silicon layer, and a gate electrode layer (a stack of a tantalum nitride layer having a thickness of 30 nm and a tungsten layer having a thickness of 370 nm) is formed over the gate insulating layer. In the silicon layer, a source electrode layer and a drain electrode layer (a stack of a titanium layer having a thickness of 60 nm, a titanium nitride layer having a thickness of 40 nm, an aluminum layer having a thickness of 300 nm, and a titanium layer having a thickness of 100 nm in this order) which are connected to a source region and a drain region (impurity regions containing phosphorus as an impurity element imparting n-type conductivity), respectively, are formed. In addition, a source electrode layer and a drain electrode layer (a stack of a titanium layer having a thickness of 60 nm, a titanium nitride layer having a thickness of 40 nm, an aluminum layer having a thickness of 300 nm, and a titanium layer having a thickness of 100 nm in this order) which are connected to a source region and a drain region (impurity regions containing boron as an impurity element imparting p-type conductivity), respectively, are formed. Further, an interlayer insulating layer (a stack of a silicon oxide film having a thickness of 50 nm, a silicon nitride oxide film having a thickness of 300 nm, and a silicon oxide film having a thickness of 450 nm in this order) is formed over the thin film transistor. The thin film transistor according to this example is formed so as to have a channel length L of 10 μm and a channel width W of 8 μm.

Figure 18A:
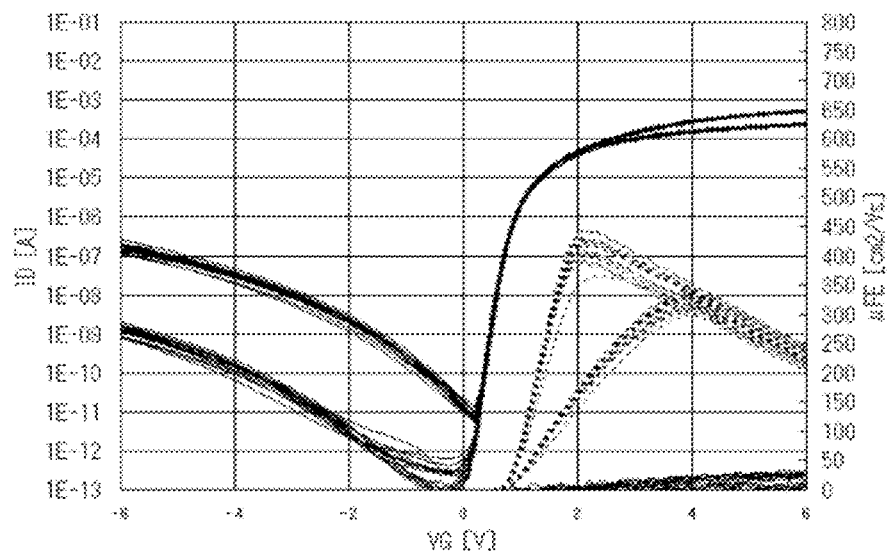
FIGS. 18A and 18B are graphs showing current vs. voltage characteristics of a semiconductor device according to Example 2.
Figure 18B:
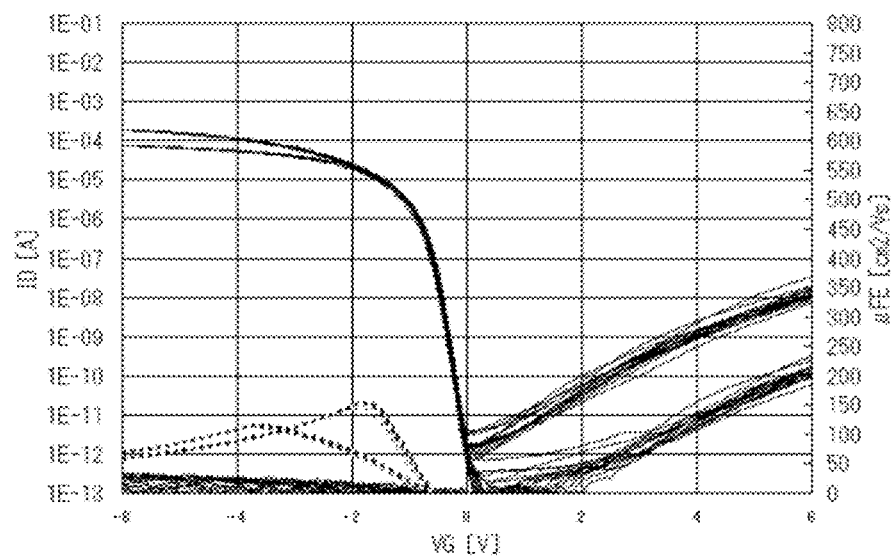

FIGS. 18A and 18B show measurement results of drain current vs. gate voltage ($I_d$-$V_g$) characteristics and field effect mobility vs. gate voltage ($\mu_{FE}$-$V_g$) characteristics of the above thin film transistors. FIG. 18A shows measurement results of an n-channel thin film transistor, and FIG. 18B shows results of a p-channel thin film transistor. Here, in each of the graphs showing $I_d$-$V_g$ characteristics, the horizontal axis indicates a voltage (V) and the vertical axis indicates a current (A). In addition, in each of the graphs showing $V_g$-$\|_{FE}$ characteristics, the horizontal axis indicates a voltage (V), and the vertical axis indicates a field effect mobility ($cm^2/Vs$). The measurement was performed under the condition in which a drain voltage ($V_d$) was 1 V or 3 V, and a gate voltage ($V_g$) was changed from −6 V to 6 V. Note that FIGS. 18A and 18B show experiment results of measurements at 16 points.

From the foregoing results, it was confirmed that, even when a supporting substrate having low heat resistance is used, it was possible to reduce crystal defects sufficiently by applying one embodiment of the present invention. In addition, it was confirmed that it was possible to manufacture an SOI substrate having excellent crystallinity with high yield. Moreover, it was confirmed that it was possible to manufacture a semiconductor device having excellent characteristics using such an SOI substrate.

The present application is based on Japanese Patent Application serial No. 2008-167618 filed with Japan Patent Office on Jun. 26, 2008, the entire contents of which are hereby incorporated by reference.

What is claimed is:

1. A method for manufacturing an SOI substrate comprising the steps of:
    forming an insulating film on a surface of a single crystal semiconductor substrate;
    forming an embrittlement region in the single crystal semiconductor substrate by irradiating the single crystal semiconductor substrate with an ion beam through the insulating film;
    etching a projection of a surface of a supporting substrate by a first plasma treatment;
    attaching the insulating film on the side of the single crystal semiconductor substrate, on which the embrittlement region is formed, and the etched surface of the supporting substrate;
    separating the single crystal semiconductor substrate in the embrittlement region by a heat treatment into the supporting substrate to which a single crystal semiconductor layer is attached, and part of the single crystal semiconductor substrate;
    irradiating the single crystal semiconductor layer with laser light after separating the single crystal semiconductor substrate;
    etching a surface of the single crystal semiconductor layer after irradiating the single crystal semiconductor layer; and
    performing a second plasma treatment on the surface of the single crystal semiconductor layer after etching the surface of the single crystal semiconductor layer;
    wherein the surface of the single crystal semiconductor layer is exposed to plasma including an OH free radical in the second plasma treatment.

2. A method for manufacturing an SOI substrate comprising the steps of:
    forming an insulating film on a surface of a single crystal semiconductor substrate;
    forming an embrittlement region in the single crystal semiconductor substrate by irradiating the single crystal semiconductor substrate with an ion beam through the insulating film;
    etching a projection of a surface of a supporting substrate by a first plasma treatment;
    attaching the insulating film on the side of the single crystal semiconductor substrate, on which the embrittlement region is formed, and the etched surface of the supporting substrate;
    separating the single crystal semiconductor substrate in the embrittlement region by a heat treatment into the supporting substrate to which a single crystal semiconductor layer is attached, and part of the single crystal semiconductor substrate;
    irradiating the single crystal semiconductor layer with laser light after separating the single crystal semiconductor substrate;
    etching a surface of the single crystal semiconductor layer after irradiating the single crystal semiconductor layer;
    performing a second plasma treatment on the surface of the single crystal semiconductor layer after etching the surface of the single crystal semiconductor layer;
    wherein the surface of the single crystal semiconductor layer is exposed to plasma including an OH free radical in the second plasma treatment; and
    performing a heat treatment on the single crystal semiconductor layer after performing the second plasma treatment.

3. A method for manufacturing an SOI substrate comprising the steps of:
    forming an insulating film on a surface of a single crystal semiconductor substrate;
    forming an embrittlement region in the single crystal semiconductor substrate by irradiating the single crystal semiconductor substrate with an ion beam through the insulating film;
    etching a projection of a surface of a supporting substrate by a first plasma treatment;

attaching the insulating film on the side of the single crystal semiconductor substrate, on which the embrittlement region is formed, and the etched surface of the supporting substrate;

separating the single crystal semiconductor substrate in the embrittlement region by a heat treatment into the supporting substrate to which a single crystal semiconductor layer is attached, and part of the single crystal semiconductor substrate;

irradiating the single crystal semiconductor layer with laser light after separating the single crystal semiconductor substrate;

etching a surface of the single crystal semiconductor layer after irradiating the single crystal semiconductor layer;

performing a heat treatment on the single crystal semiconductor layer after etching the surface of the single crystal semiconductor layer; and performing a second plasma treatment on the surface of the single crystal semiconductor layer after performing the heat treatment;

wherein the surface of the single crystal semiconductor layer is exposed to plasma including an OH free radical in the second plasma treatment.

4. A method for manufacturing an SOI substrate comprising the steps of:

forming a first insulating film on a surface of a single crystal semiconductor substrate;

forming an embrittlement region in the single crystal semiconductor substrate by irradiating the single crystal semiconductor substrate with an ion beam through the first insulating film;

etching a projection of a surface of a supporting substrate by a first plasma treatment;

forming a second insulating film over the first insulating film;

attaching the single crystal semiconductor substrate to the etched surface of the supporting substrate with the first insulating film and the second insulating film interposed therebetween so that the single crystal semiconductor substrate and the supporting substrate face to each other;

separating the single crystal semiconductor substrate in the embrittlement region by a heat treatment into the supporting substrate to which a single crystal semiconductor layer is attached, and part of the single crystal semiconductor substrate;

irradiating the single crystal semiconductor layer with laser light after separating the single crystal semiconductor substrate;

etching a surface of the single crystal semiconductor layer after irradiating the single crystal semiconductor layer; and performing a second plasma treatment on the surface of the single crystal semiconductor layer after etching the surface of the single crystal semiconductor layer;

wherein the surface of the single crystal semiconductor layer is exposed to plasma including an OH free radical in the second plasma treatment.

5. A method for manufacturing an SOI substrate comprising the steps of:

forming a first insulating film over a single crystal semiconductor substrate;

forming an embrittlement region in the single crystal semiconductor substrate by irradiating the single crystal semiconductor substrate with an ion beam through the first insulating film;

etching a projection of a surface of a supporting substrate by a first plasma treatment;

forming a second insulating film including aluminum over the planarized supporting substrate by a sputtering method;

attaching the single crystal semiconductor substrate to the etched surface of the supporting substrate with the first insulating film and the second insulating film interposed therebetween so that the single crystal semiconductor substrate and the supporting substrate face to each other;

separating the single crystal semiconductor substrate in the embrittlement region by a heat treatment into the supporting substrate to which a single crystal semiconductor layer is attached, and part of the single crystal semiconductor substrate;

irradiating the single crystal semiconductor layer with laser light after separating the single crystal semiconductor substrate;

etching a surface of the single crystal semiconductor layer after irradiating the single crystal semiconductor layer; and performing a second plasma treatment on the surface of the single crystal semiconductor layer after etching the surface of the single crystal semiconductor layer;

wherein the surface of the single crystal semiconductor layer is exposed to plasma including an OH free radical in the second plasma treatment.

6. The method for manufacturing an SOI substrate according to claim 1, wherein the second plasma treatment is performed while the supporting substrate to which the single crystal semiconductor layer is attached is heated.

7. The method for manufacturing an SOI substrate according to claim 2, wherein the second plasma treatment is performed while the supporting substrate to which the single crystal semiconductor layer is attached is heated.

8. The method for manufacturing an SOI substrate according to claim 3, wherein the second plasma treatment is performed while the supporting substrate to which the single crystal semiconductor layer is attached is heated.

9. The method for manufacturing an SOI substrate according to claim 4, wherein the second plasma treatment is performed while the supporting substrate to which the single crystal semiconductor layer is attached is heated.

10. The method for manufacturing an SOI substrate according to claim 5, wherein the second plasma treatment is performed while the supporting substrate to which the single crystal semiconductor layer is attached is heated.

11. The method for manufacturing an SOI substrate according to claim 1, wherein the heated supporting substrate to which the single crystal semiconductor layer is attached has a temperature of equal to or greater than 100° C. and equal to or less than 280° C.

12. The method for manufacturing an SOI substrate according to claim 2, wherein the heated supporting substrate to which the single crystal semiconductor layer is attached has a temperature of equal to or greater than 100° C. and equal to or less than 280° C.

13. The method for manufacturing an SOI substrate according to claim 3, wherein the heated supporting substrate to which the single crystal semiconductor layer is attached has a temperature of equal to or greater than 100° C. and equal to or less than 280° C.

14. The method for manufacturing an SOI substrate according to claim 4, wherein the heated supporting substrate to which the single crystal semiconductor layer is attached has a temperature of equal to or greater than 100° C. and equal to or less than 280° C.

15. The method for manufacturing an SOI substrate according to claim 5, wherein the heated supporting substrate to which the single crystal semiconductor layer is attached has a temperature of equal to or greater than 100° C. and equal to or less than 280° C.

16. The method for manufacturing an SOI substrate according to claim 1, wherein the heated supporting substrate to which the single crystal semiconductor layer is attached has a temperature of equal to or greater than 220° C. and equal to or less than 280° C.

17. The method for manufacturing an SOI substrate according to claim 2, wherein the heated supporting substrate to which the single crystal semiconductor layer is attached has a temperature of equal to or greater than 220° C. and equal to or less than 280° C.

18. The method for manufacturing an SOI substrate according to claim 3, wherein the heated supporting substrate to which the single crystal semiconductor layer is attached has a temperature of equal to or greater than 220° C. and equal to or less than 280° C.

19. The method for manufacturing an SOI substrate according to claim 4, wherein the heated supporting substrate to which the single crystal semiconductor layer is attached has a temperature of equal to or greater than 220° C. and equal to or less than 280° C.

20. The method for manufacturing an SOI substrate according to claim 5, wherein the heated supporting substrate to which the single crystal semiconductor layer is attached has a temperature of equal to or greater than 220° C. and equal to or less than 280° C.

21. The method for manufacturing an SOI substrate according to claim 1, wherein the second plasma treatment is performed with a plasma treatment apparatus in which a plasma generation chamber and a reaction chamber are separated from each other.

22. The method for manufacturing an SOI substrate according to claim 2, wherein the second plasma treatment is performed with a plasma treatment apparatus in which a plasma generation chamber and a reaction chamber are separated from each other.

23. The method for manufacturing an SOI substrate according to claim 3, wherein the second plasma treatment is performed with a plasma treatment apparatus in which a plasma generation chamber and a reaction chamber are separated from each other.

24. The method for manufacturing an SOI substrate according to claim 4, wherein the second plasma treatment is performed with a plasma treatment apparatus in which a plasma generation chamber and a reaction chamber are separated from each other.

25. The method for manufacturing an SOI substrate according to claim 5, wherein the second plasma treatment is performed with a plasma treatment apparatus in which a plasma generation chamber and a reaction chamber are separated from each other.

26. The method for manufacturing an SOI substrate according to claim 1, wherein the first supporting substrate is a glass substrate.

27. The method for manufacturing an SOI substrate according to claim 2, wherein the first supporting substrate is a glass substrate.

28. The method for manufacturing an SOI substrate according to claim 3, wherein the first supporting substrate is a glass substrate.

29. The method for manufacturing an SOI substrate according to claim 4, wherein the first supporting substrate is a glass substrate.

30. The method for manufacturing an SOI substrate according to claim 5, wherein the first supporting substrate is a glass substrate.

31. The method for manufacturing an SOI substrate according to claim 1, wherein the first plasma treatment is performed by introducing an inert gas and/or a reactive gas into a vacuum chamber and applying bias voltage to the surface of the supporting substrate.

32. The method for manufacturing an SOI substrate according to claim 2, wherein the first plasma treatment is performed by introducing an inert gas and/or a reactive gas into a vacuum chamber and applying bias voltage to the surface of the supporting substrate.

33. The method for manufacturing an SOI substrate according to claim 3, wherein the first plasma treatment is performed by introducing an inert gas and/or a reactive gas into a vacuum chamber and applying bias voltage to the surface of the supporting substrate.

34. The method for manufacturing an SOI substrate according to claim 4, wherein the first plasma treatment is performed by introducing an inert gas and/or a reactive gas into a vacuum chamber and applying bias voltage to the surface of the supporting substrate.

35. The method for manufacturing an SOI substrate according to claim 5, wherein the first plasma treatment is performed by introducing an inert gas and/or a reactive gas into a vacuum chamber and applying bias voltage to the surface of the supporting substrate.

* * * * *